(12) United States Patent
Slotboom et al.

(10) Patent No.: US 8,477,289 B2
(45) Date of Patent: Jul. 2, 2013

(54) POSITION MEASUREMENT USING NATURAL FREQUENCY VIBRATION OF A PATTERN

(75) Inventors: Daan Maurtis Slotboom, Rhenen (NL); Johan Hendrik Geerke, Eindhoven (NL); Igor Matheus Petronella Aarts, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 773 days.

(21) Appl. No.: 12/476,809

(22) Filed: Jun. 2, 2009

(65) Prior Publication Data

US 2009/0296058 A1    Dec. 3, 2009

Related U.S. Application Data

(60) Provisional application No. 61/129,048, filed on Jun. 2, 2008, provisional application No. 61/138,685, filed on Dec. 18, 2008, provisional application No. 61/153,529, filed on Feb. 18, 2009.

(51) Int. Cl.
*G03B 27/32* (2006.01)
*G01B 11/14* (2006.01)

(52) U.S. Cl.
USPC .......................................... 355/77; 356/614

(58) Field of Classification Search
USPC ............. 355/55, 53; 356/399–401, 614, 624
See application file for complete search history.

(56) References Cited

U.S. PATENT DOCUMENTS

| 3,771,872 | A | * | 11/1973 | Nightingale et al. | ......... 355/125 |
| 5,028,797 | A | * | 7/1991 | Abe et al. | ....................... 250/548 |
| 5,298,363 | A | | 3/1994 | Weiss | |
| 5,418,613 | A | * | 5/1995 | Matsutani | ..................... 356/401 |
| 5,615,006 | A | | 3/1997 | Hirukawa et al. | |
| 5,674,650 | A | | 10/1997 | Dirksen et al. | |

(Continued)

FOREIGN PATENT DOCUMENTS

| CN | 1976021 A | 6/2007 |
| EP | 0906590 B1 | 8/2003 |

(Continued)

OTHER PUBLICATIONS

Office Action in related Chinese application No. 200910203134.2 issued Nov. 26, 2010.

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A detection method for detecting a property of an extended pattern formed by at least one line generally extending in a first direction. The extended pattern is formed on a substrate or on a substrate table and may extend, for example, over a length of at least 50× the width of the line. The extended pattern is focus sensitive. The detection method includes moving the substrate table in a first direction and measuring along that first direction a property of the extended pattern. The property can be a result of a physical property of the extended pattern in a second direction perpendicular to the first direction. In a next step a calibration of the substrate table position can be derived from the measured position of the extended pattern.

8 Claims, 18 Drawing Sheets

U.S. PATENT DOCUMENTS

| | | | |
|---|---|---|---|
| 5,709,970 | A | 1/1998 | Hashimoto |
| 6,057,908 | A | 5/2000 | Ota |
| 6,130,750 | A | 10/2000 | Ausschnitt et al. |
| 6,294,450 | B1 | 9/2001 | Chen et al. |
| 6,344,896 | B1 | 2/2002 | Saito |
| 6,440,616 | B1 | 8/2002 | Izuha et al. |
| 6,654,107 | B1 | 11/2003 | Watanabe et al. |
| 6,674,511 | B2 | 1/2004 | Nomura et al. |
| 6,701,512 | B2 | 3/2004 | Sutani et al. |
| 6,844,918 | B2 * | 1/2005 | Koren et al. .................. 355/53 |
| 7,102,736 | B2 | 9/2006 | Schoormans et al. |
| 7,112,890 | B2 | 9/2006 | Markoya |
| 7,198,873 | B2 | 4/2007 | Geh et al. |
| 7,248,349 | B2 | 7/2007 | Sato et al. |
| 7,250,235 | B2 | 7/2007 | Izuha et al. |
| 7,408,655 | B2 | 8/2008 | Loopstra et al. |
| 7,433,018 | B2 * | 10/2008 | Butler .......................... 355/53 |
| 7,639,997 | B2 | 12/2009 | Watanabe et al. |
| 7,889,314 | B2 | 2/2011 | Koenen |
| 2002/0155356 | A1 | 10/2002 | Fujimoto |
| 2002/0158193 | A1 | 10/2002 | Sezginer et al. |
| 2003/0098528 | A1 | 5/2003 | Chiu et al. |
| 2004/0167748 | A1 | 8/2004 | Zhang et al. |
| 2005/0208391 | A1 | 9/2005 | Mieher et al. |
| 2005/0286042 | A1 | 12/2005 | Schoormans et al. |
| 2006/0289412 | A1 | 12/2006 | Hamada |
| 2006/0290914 | A1 | 12/2006 | Van Der Pasch et al. |
| 2007/0019176 | A1 | 1/2007 | Akamatsu |
| 2007/0099097 | A1 | 5/2007 | Kang |
| 2007/0146670 | A1 | 6/2007 | Kruijswijk |
| 2007/0166633 | A1 | 7/2007 | Yamada |
| 2008/0018874 | A1 | 1/2008 | Dusa et al. |
| 2008/0043212 | A1 | 2/2008 | Shibazaki |
| 2008/0088812 | A1 | 4/2008 | Magnusson |
| 2008/0094593 | A1 | 4/2008 | Shibazaki |
| 2009/0097002 | A1 | 4/2009 | Fukuda et al. |

FOREIGN PATENT DOCUMENTS

| | | |
|---|---|---|
| EP | 1372040 A2 | 12/2003 |
| JP | 62-294552 | 12/1987 |
| JP | 63-147281 | 6/1988 |
| JP | 02-157844 | 6/1990 |
| JP | 04-065603 | 3/1992 |
| JP | 06-117831 A | 4/1994 |
| JP | 06-302492 A | 10/1994 |
| JP | 08-083751 | 3/1996 |
| JP | 09-504142 | 4/1997 |
| JP | 09-270379 | 10/1997 |
| JP | 10-055946 A | 2/1998 |
| JP | 2010-284404 A | 10/1998 |
| JP | 10-335210 | 12/1998 |
| JP | 11-186145 | 7/1999 |
| JP | 11-186155 A | 7/1999 |
| JP | 2001-074606 A | 3/2001 |
| JP | 2001-250769 | 9/2001 |
| JP | 2001-274059 A | 10/2001 |
| JP | 2002-055435 A | 2/2002 |
| JP | 2002-289503 A | 10/2002 |
| JP | 2003-051436 | 2/2003 |
| JP | 2003-142385 A | 5/2003 |
| JP | 2003-197510 A | 7/2003 |
| JP | 2004-170947 | 6/2004 |
| JP | 2004-519716 T | 7/2004 |
| JP | 2004-259765 A | 9/2004 |
| JP | 2005-038032 A | 2/2005 |
| JP | 2006-308855 A | 4/2005 |
| JP | 2005-136428 A | 5/2005 |
| JP | 2005-273916 A | 10/2005 |
| JP | 2006-54452 A | 2/2006 |
| JP | 2009-109705 A | 5/2006 |
| JP | 2006-145746 A | 6/2006 |
| JP | 2006157041 A | 6/2006 |
| JP | 2006-301301 A | 11/2006 |
| JP | 2006-349945 A | 12/2006 |
| JP | 2007-180547 A | 7/2007 |
| JP | 2007-201298 A | 8/2007 |
| JP | 2007-235513 A | 9/2007 |
| JP | 2007-281384 A | 10/2007 |
| JP | 2007-281449 A | 10/2007 |
| JP | 2000-315642 A | 8/2011 |
| WO | 03/021352 | 3/2003 |
| WO | 2005-084873 | 9/2005 |

OTHER PUBLICATIONS

Australian Search Report in related Singapore application No. 200903748 mailed May 11, 2011.

Chinese Office Action in related application No. 200910203133.8 mailed Apr. 1, 2011.

Office Action in related Japanese Application No. 2009-132700 mailed Jul. 12, 2011.

Office Action in related Japanese Application No. 2009-132702 mailed Jul. 7, 2011.

Search Report in related Australian Application No. 0903749-0 mailed Jul. 25, 2010.

Japanese Office Action mailed Mar. 15, 2012 in corresponding Japanese Patent Application No. 2009-132702.

Japanese Office Action mailed Mar. 15, 2012 in corresponding Japanese Patent Application No. 2009-132706.

European Search Report dated Mar. 14, 2012 in corresponding European Patent Application No. 09161548.4.

European Search Report dated Mar. 14, 2012 in corresponding European Patent Application No. 09161547.6.

Chinese Office Action dated Feb. 14, 2012 in corresponding Chinese Patent Application No. 200910203135.7.

U.S. Office Action dated Aug. 6, 2012 in corresponding U.S. Appl. No. 12/476,739.

U.S. Notice of Allowance dated Feb. 15, 2013 in corresponding U.S. Appl. No. 12/476,739.

* cited by examiner

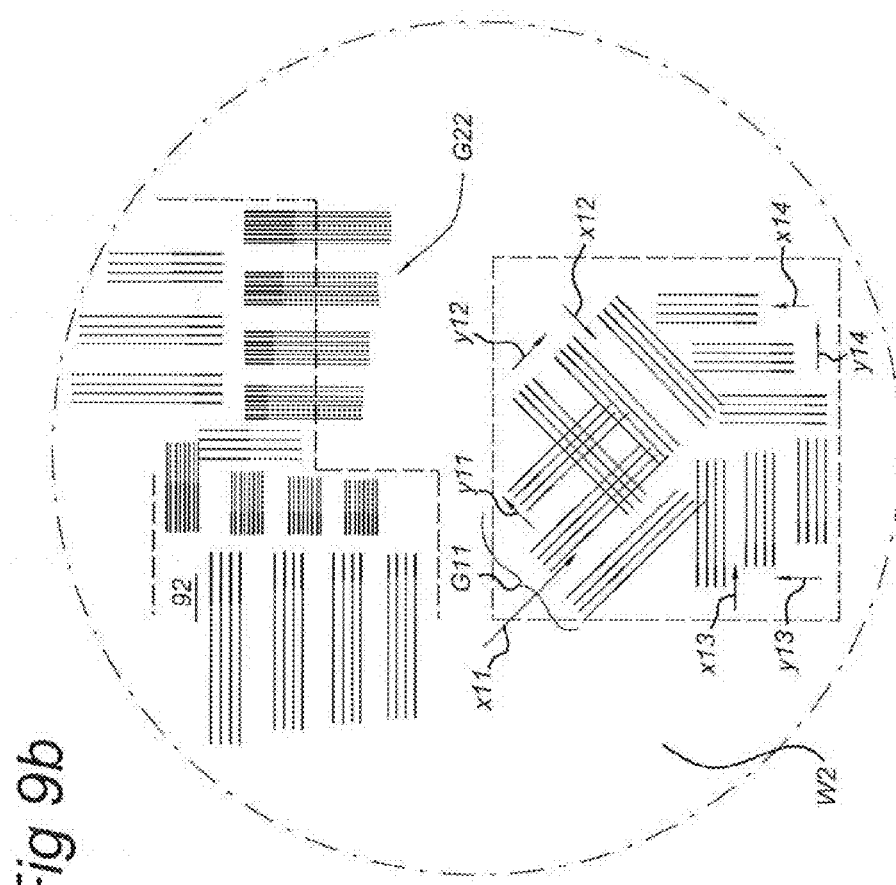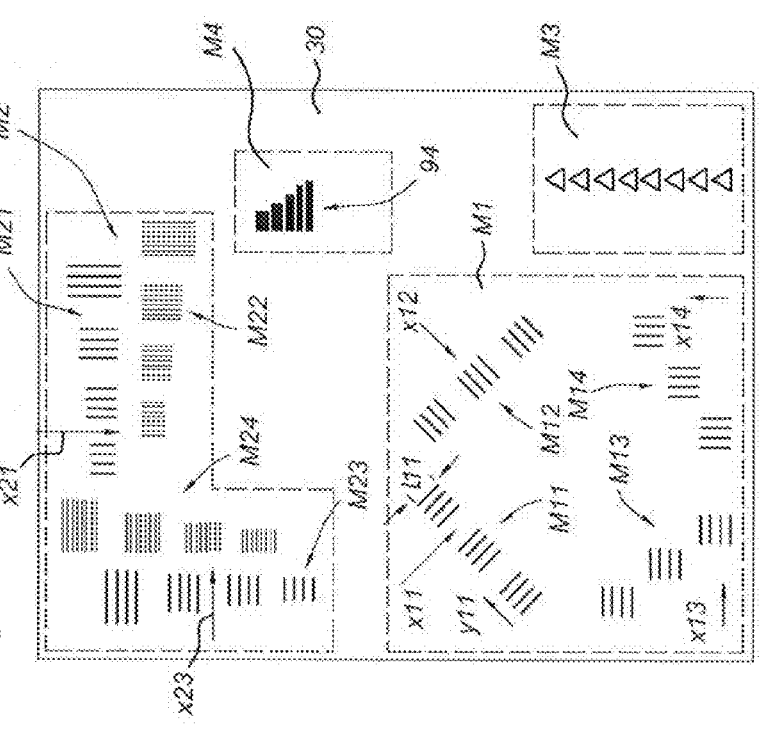

A  A

US 8,477,289 B2

POSITION MEASUREMENT USING NATURAL FREQUENCY VIBRATION OF A PATTERN

CROSS REFERENCE TO RELATED APPLICATIONS

This application claims priority and benefit under 35 U.S.C. §119(e) to U.S. Provisional Patent Application No. 61/129,048, entitled "Lithographic Apparatus and Device Manufacturing Method", filed on Jun. 2, 2008, U.S. Provisional Patent Application No. 61/138,685, entitled "Lithographic Apparatus and Device Manufacturing Method", filed on Dec. 18, 2008, and U.S. Provisional Patent Application No. 61/153,529, entitled "Lithographic Apparatus and Device Manufacturing Method", filed on Feb. 18, 2009. The contents of those applications are incorporated herein in their entirety by reference.

FIELD

The present invention relates to a method of detection and in particular to a method of stage positioning. The invention further relates to a calibration method for calibrating a stage position of a lithographic apparatus and to a lithographic apparatus. In an embodiment a stage positioning system is provided. The invention further relates to obtaining a calibration map for a property of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to make use of an encoder measurement system in order to measure a position of a stage (such as a substrate stage or patterning device stage) in the lithographic apparatus. Thereto, a (e.g., two dimensional) encoder grid is applied to a first part of the lithographic apparatus, while encoder sensors heads are connected to a second part of the lithographic apparatus. In an embodiment the encoder grid is connected to a reference structure of the lithographic apparatus, while encoder sensor heads are connected to the stage so as to follow its position. In another embodiment the encoder grid is connected to the stage and the encoder sensor heads are connected to the reference structure. In order to calibrate the encoder measurement system, a plurality of calibrations is performed, which may result in a long calibration time and may result in loss of accuracy by stitching together the different calibration results for the various frequency bands.

In applications of a lithographic apparatus marks are used for different detection methods such as alignment and overlay measurements. More detailed information with respect to a substrate and performance of the lithographic apparatus is desirable and detecting a relevant property is becoming more and more time consuming.

SUMMARY

It is desirable to provide an improved detection method for detecting a property of a formed structure on a substrate.

According to an embodiment of the invention, there is provided a method for measuring a property of an extended pattern formed by one or more lines generally extending in a first direction wherein each line comprises one or more features, comprising using the one or more features for measuring with a sensor a property of the extended pattern at different positions along the first direction by changing the relative positions of the sensor and a support structure for supporting an object comprising the extended pattern.

In another embodiment of the invention, there is provided a lithographic exposure apparatus comprising:

a substrate table constructed to hold a substrate, at least one of the substrate table and substrate having an extended pattern formed by at least one line extending in a first direction;

a controller configured to move the substrate table and to control measurement of a property of the extended pattern along the first direction of the extended pattern.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 9a illustrates a patterning device for forming extended patterns according to an embodiment of the invention, FIG. 9b illustrates a substrate having extended patterns according to an embodiment of the invention.

FIG. 13a illustrates an extended pattern having focal mark units and a diffractive pattern thereof;

FIGS. 13b and 13c illustrate a diffractive pattern of an extended pattern according to the embodiment of FIG. 13a;

DETAILED DESCRIPTION

Figure 1:
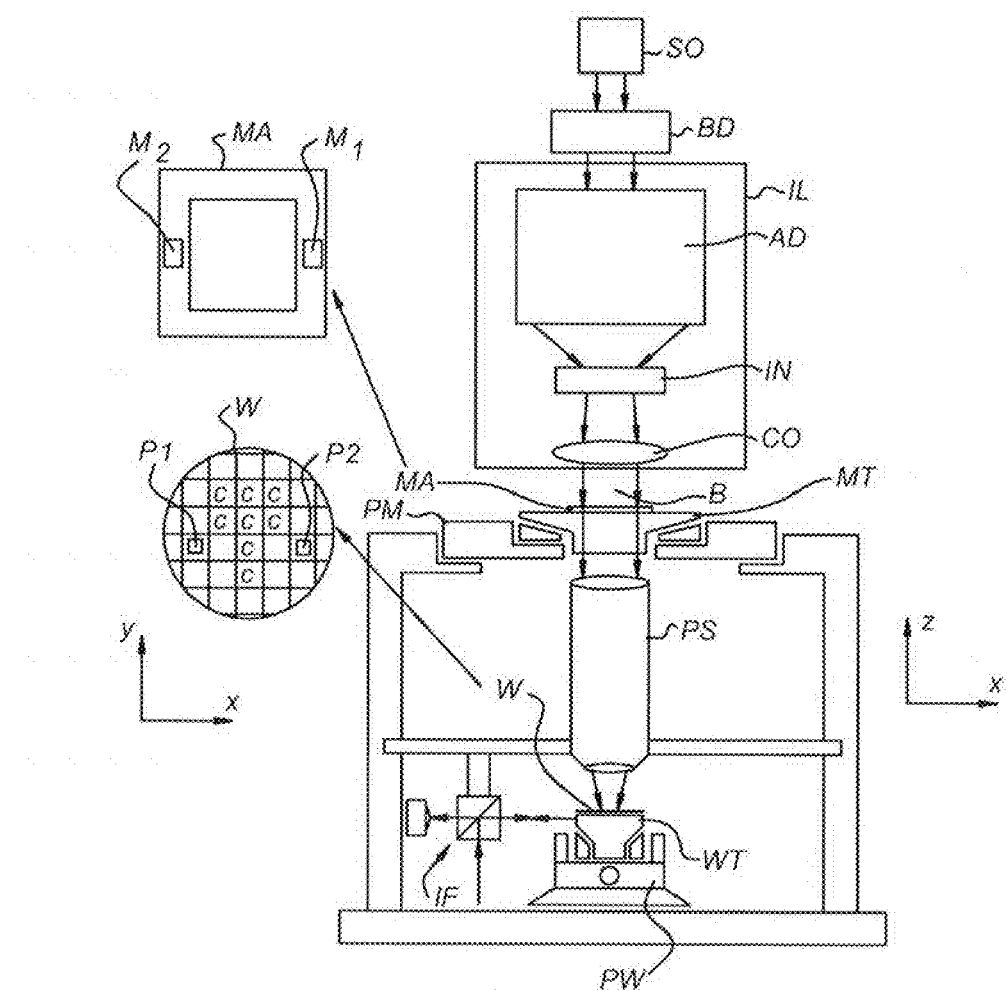
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g., UV or EUV radiation, or any other suitable radiation), a patterning device support or support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). One or more additional tables or "supports" may be provided next to the substrate table(s) (or mask table(s)) for other purposes than holding a substrate (or mask). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. Such an immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD, if required, may be referred to as a radiation system.

The illuminator IL may include an adjuster AD configured to adjust the intensity distribution of the radiation beam. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection system PS, which focuses the beam onto a target portion C of the substrate W. With the aid of the second positioning device PW and position sensor IF (e.g., an interferometric device, linear single or multi dimensional encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

In general, movement of the patterning device support (e.g., mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed. Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies.

The depicted apparatus could be used in at least one of the following modes:

1. In step mode, the patterning device support (e.g., mask table) MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the patterning device support (e.g., mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

The lithographic apparatus comprises a metrology device such as an alignment sensor for measuring one or more properties of the extended patterns while moving the substrate table supporting the substrate having the extended pattern relative to the metrology device. The metrology device is arranged to combine a position of the substrate table and/or the substrate with said measured property.

The alignment sensor may be of a vision type (i.e., comprising a CCD camera, diodes and interferometers) or of a diffraction based type, such as disclosed in EP 0906590 or in EP 1 372 040 which are hereby included by reference in their entirety. Some embodiments use specific types such as diffraction based types.

Combinations and/or variations on the above described modes of use or entirely different modes of use may also be employed.

Hereunder forming the extended pattern and auxiliary elements arranged to assist reading the extended pattern are first explained. Thereafter several embodiments of a method of detecting a property of the extended pattern are explained. Specific references will be made to an alignment and calibration method.

In an embodiment a method is provided for calculating a calibration map (1 dimensional, 2 dimensional or multi-dimensional) comprising detecting a property of an extended pattern in a second direction by moving along the extended pattern in a first direction, both directions being generally perpendicular.

Figure 2:
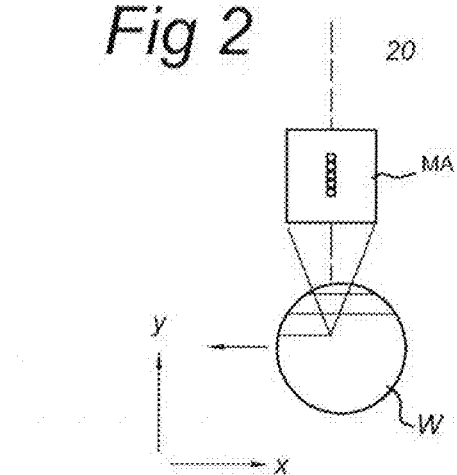
FIG. 2 depicts a view of a pattern projected onto a substrate, to illustrate a part of the calibration according to an embodiment of the invention.
Figure 3:
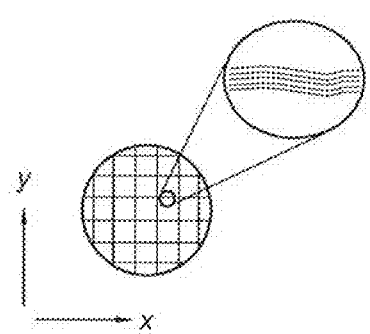
FIG. 3 depicts a raster obtained on the substrate according to an embodiment of the invention.

An example of an extended pattern is shown in the detail of FIG. 3 as formed on the substrate as shown in FIG. 3, using a patterning device MA as shown in FIG. 2. First, embodiments of the patterning device MA will be explained, thereafter embodiments of the extended pattern.

Forming the Extended Pattern; Patterning Device

An embodiment of the method and lithographic apparatus comprises forming the extended pattern on the substrate. FIG. 2 depicts a patterning device (e.g., mask) MA having a pattern, which pattern is projected onto the substrate W via a projection system (not shown) and making use of an irradiation source to generate a radiation beam (also not shown in FIG. 2) that can be used for forming an extended pattern.

The patterning device MA according to the embodiment of FIG. 2 comprises five equidistant points. In an embodiment the points are separated by a distance equal to the size of the points.

The distance between the points, that is the distance in the y-direction, can vary from 50 nm to 10 mm, in an embodiment 50 nm-0.5 mm. The size of the points can vary from 50 nm to 10 mm, in an embodiment 50 nm-0.5 mm. In an embodiment the distance/size is within a 1000 nm-0.05 mm range.

In the embodiment according to FIG. 2 the points have a rectangular shape, in an embodiment having the longer length in the x direction. Examples are shown in and will be discussed referring to FIG. 9*a*. In an embodiment the points have a square shape. The shape of the points is adapted to form a structure on a substrate, wherein said structure is evenly formed throughout the projected point.

In an embodiment the patterning device MA comprises multiple sets of points. The sets of points are clustered at different positions on the patterning device MA. The sets of points can have different sizes, e.g., different sized points and different distances between in the points. In an embodiment the centerlines of the set of points are parallel. By using different sized points, extended patterns can be obtained having different sized lines. This can allow measuring lens properties or illuminating device properties with respect to illuminating different sized surface areas on a substrate.

In an embodiment the points of a single set of points are positioned on the same centerline 20, indicated with a dotted line in FIG. 2. In an embodiment a single set of points comprises at least three points, in a specific embodiment at least five points, and in a particular embodiment at least seven points.

In an embodiment a patterning device is provided in the maskless mode. The maskless patterning device can provide patterns for illumination that change during illumination. Within the scope of extended patterns according to this application, different embodiments of a maskless patterning device are feasible. In an embodiment the maskless patterning device provided points of variable shape, length and inter-distance during illumination.

In an embodiment the maskless mode comprising a programmable patterning device is used for forming an extended pattern by moving the substrate table. In another embodiment the maskless mode comprising a programmable patterning device is used for forming an extended pattern without moving the substrate table. The points of the patterning device are programmed to 'move' over the surface of the patterning device. This method will allow forming an extended pattern and detecting a property of the formed extended pattern allowing calibration of the programmable patterning device.

FIG. 9*a* illustrates a patterning device 30 having a set of different patterns for forming an extended pattern according to embodiments of the invention. Group M1 is a set of rectangular shaped patterns positioned at different angles on the patterning device 30. Sub group M11 can be used to create patterns in a direction x11 by moving a substrate in direction x11. Subgroup of patterns M12 will create extended patterns on a substrate if the substrate is moved according to x12 in a direction perpendicular to group M11. During irradiation three extended patterns will be created simultaneously on the substrate. By illuminating three patterns simultaneously, three extended patterns having similar errors in alignment/calibration will be created, that can be scanned for errors in a subsequent detection method for detecting a property, in particular a property relating to the error in alignment, such as a positioning property.

Using pattern groups M13 and M14 three extended patterns can be created wherein a possible alignment/calibration error in positioning will be shifted with respect to the position along the created extended pattern in the directions x13, x14 respectively. This will allow scanning the created extended patterns in a subsequent detection method and allow detection of the repeating error at different positions in the respective directions x13, x14 in the created extended pattern.

A rectangular shaped pattern in the patterning device allows irradiating a position on the substrate during a longer time span. While the substrate W is moved with respect to the patterning device 30, a position on the substrate will be illuminated linearly dependent on length L11 (and the velocity of the moving substrate table). If the pattern is longer (L11 is larger), a higher speed of the substrate table WS is possible, even though a similar exposure energy is irradiated at a certain position of the formed extended pattern. A longer pattern will allow moving the substrate table at higher speed.

Further a possible error (in positioning or the like) will be averaged at the position of the created extended pattern on the substrate. In an exaggerated embodiment a possible error in positioning in the y11 direction according to FIG. 9*a*, will result in a local widening (and lower exposure) of the formed grid line at the error position. The lower average exposure at the position can be a further property of the extended pattern that can be detected in a subsequent detection method for detecting a property of the formed extended pattern and subsequent calibration of a relevant property of the lithographic apparatus.

In the embodiment according to FIG. 9*a* extended patterns can be formed on a substrate without intermediate rotation of the substrate stage WS or patterning device MA.

Further, the patterning device 30 according to FIG. 9*a* comprises a group M21 and M23 of rectangular shaped lines equidistantly spaced. The length of the rectangular shaped elements is the different sets of lines are however of different length. During irradiation of groups M21 and M23 by moving the substrate table in the x21 and x23 direction respectively, results in extended patterns extending in the x21 and x23 direction comprising lines that have been exposed during different time intervals. The right-hand side patterns of M21 will have less illumination than the left-hand side patterns. These exposure variations in the formed extended marks can be measured in a subsequent detection method. In the subsequent detection step the exposure variance due to different lengths of the patterns used in the patterning device can be used for calibration of Z focus in the lithographic apparatus.

In an embodiment a pattern M4 is used to form an extended pattern of grid lines. In this embodiment the formed extended pattern will have a variable diffraction in the direction x4 over the extended pattern due to different exposure duration of the formed grid lines of the extended pattern. The slope of the diffractive pattern, similar to FIG. 5*b*, will be slightly different for each zero crossing due to the different exposure lengths of the formed grid lines.

Another example of a pattern to be used for forming an extended pattern according to an embodiment of the invention is shown in FIG. 9*a* as pattern M3 formed by triangle shaped points. Illumination of the substrate using triangle shaped points will result in an extended pattern of grid lines, wherein each line in itself will show different exposure properties. In the embodiment according to pattern M3, the formed lines of the extended pattern will have a top side that is illuminated during a much shorter period than the underside of the mark is. This will lead to exposure properties present in the formed extended pattern that can be detected and measured in a subsequent detection step and that can be used in a subsequent calibration step of a calibration method, e.g., for calibrating Z focus.

Different shaped points are possible for obtaining similar embodiments for forming, detecting and calibrating. The points can have a circular form, an hourglass form or similar shapes that have different lengths in the first (x) direction.

Figure 9C:
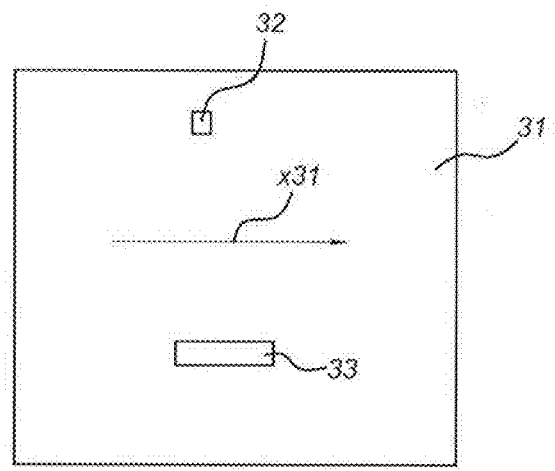
FIGS. 9c and 9d illustrate additional embodiments of patterning devices for forming extended patterns.

In another embodiment, illustrated schematically in FIG. 9c, the patterning device 31 comprises one point 32. Said one point 32 can be used for forming an extended pattern on the substrate formed by a single line. In the embodiment shown in FIG. 9c the patterning device 31 comprises two single points 32, 33. In another embodiment the patterning device comprises one or several single points separated by a distance of at least 10× the size of the points. This pattern will, if irradiated onto a substrate by moving the substrate table WT, form multiple extended patterns of single lines.

By moving a substrate table WT supporting a substrate W with respect to patterning device 31 in direction x31, two extended patterns extending in direction x31 will be formed simultaneously.

Figure 9D:
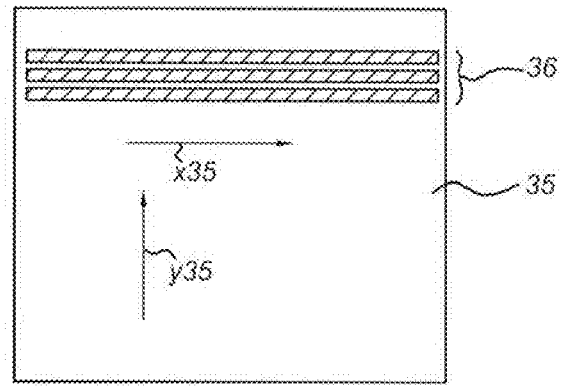

In a different embodiment illustrated in FIG. 9d a patterning device 35 is provided having a pattern of one or more extended lines 36, extending over a distance that is at least 100× the width of the line. FIG. 9d is a schematic representation. In an embodiment the extended lines 36 extend of 200 mm or more and have a width of 100 nm-10000 nm.

Projection of the extended lines 36 onto the substrate will form an extended pattern onto the substrate. Forming an extended pattern using a patterning device 35 having a pattern of an extended line is advantageous in a specific embodiment of the invention relating to e.g., a method for detection of and/or correcting for lens-heating, as will be explained in more detail below.

In an embodiment the extended line 36 comprises a modulation in direction y35. This modulation can be a regular modulation such as a wavelike modulation having a certain wavelength (extending in the x35 direction) and an amplitude extending in the y35 direction superimposed on the extended lines 36.

During the projection, the substrate W is moved in the direction x while the patterning device MA is not moving, which causes the pattern to be irradiated onto the substrate W in extended form, in the case of the embodiment according to FIG. 2 as substantially parallel lines as the pattern includes a plurality of e.g., equidistant points.

The x direction can be any direction of the lithographic apparatus. It can be any direction of the long-stroke and short-stroke module. In embodiment the x direction is a direction wherein both long-stroke modules are operated at a generally similar power. Combining both long-stroke modules in a single moving direction of the substrate stage WS results in a combined velocity that could be 1,414 times the speed of a single long-stroke module. This will allow quicker movement of the wafer stage WS and thereby a quicker formation of the extended pattern using the patterning device according to an embodiment similar to FIG. 2.

In an embodiment the direction x is perpendicular to the centerline 20 of the set of points on patterning device MA. In an embodiment the points on the patterning device MA can have a parallelogram shape, wherein the angle of the parallelogram corresponds with the x-direction.

An example of a patterning device 30 having non equidistant lines is shown in FIG. 9a in the embodiment of the group M2. In FIG. 9a different patterns on a patterning device 30 having a pattern of points and in the illustrated embodiment of rectangular shaped lines M22, M24, are shown. Groups M22 and M24 comprise eight lines of two sets of lines at similar distance. Groups M22 and M24 can be used to form extended patterns of non-equal distances grid lines.

In an embodiment an extended pattern is formed in two steps. In an embodiment in a first step a pattern device is provided having half of points of the pattern according to any of the embodiments illustrated in FIGS. 2, 9a, 9d, and in a second step the other half of the points of the pattern is provided. By forming an extended pattern in two steps an extended pattern is created having overlay errors that can be detected in a subsequent detection step and that can be calibrated in a subsequent calibration step.

In an embodiment a double lined grid pattern similar to groups M22 and M24 is used for performing the two stepped formation of an extended pattern, wherein first the gridlines of a first extended pattern are formed and in a second step the grid lines of the other extended pattern is formed.

Forming the Extended Pattern; Substrate

The formed pattern formed either by moving the substrate table WT with respect to the patterning device MA according to FIG. 2, or by projecting a pattern in the form of an extended line onto the substrate, generally extends in the first direction, in this application indicated by an x-direction.

In an embodiment grid lines extending in a first direction are formed using a pattern of equidistant points as shown in FIG. 2. In an embodiment the points are non equidistant and the formed pattern is similarly non equidistant.

Thus, the projected positions according to the embodiment of FIG. 2 are extended in the direction of movement of the substrate (table) to form an extended pattern, in this example providing substantially parallel lines. Using this technique, a raster may be created on the surface of the substrate, as schematically indicated in FIG. 2.

The substrate table WT is moved in the first direction with a generally constant velocity. In particular forming the extended pattern is started only after accelerating the substrate table to the desired constant velocity and illumination is stopped before the substrate table is decelerated. The constant velocity in the first direction results in a constant illumination per irradiated area of the substrate W.

In a further embodiment an extend pattern formed on the substrate W comprises a discontinuous line or discontinuous (grid) lines. Such a discontinuous extended pattern can be formed by moving the substrate table WT in a first direction an switching the illumination on and off. Use can be made of a pulsed laser source.

When illumination is off during formation of the discontinuous extended pattern, a dynamical property of the lithographic apparatus can be changed, e.g., the moving speed of the substrate table or the power (dose) of the illumination system.

The substrate table WT might be accelerated/decelerated while illuminating the extended pattern. This will result in a dose variation along the first direction of the extended mark. This can be used to determine the optimal dose for a certain type of mark or structure.

Figure 5A:
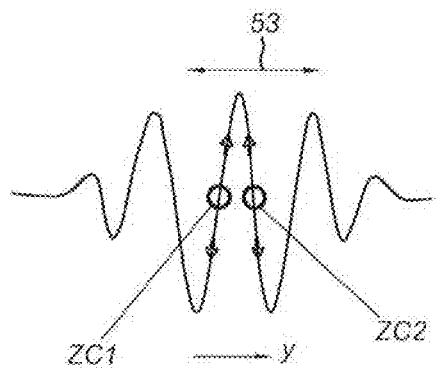
FIG. 5a illustrates an image of an alignment sensor output signal in accordance with an embodiment of the invention, the alignment sensor applied to measure the pattern depicted in FIG. 4.
Figure 5B:
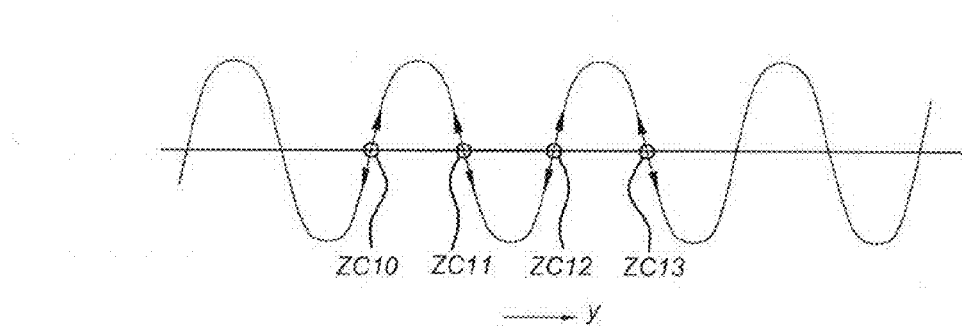
FIG. 5b illustrates an image of an alignment sensor output signal in accordance with another embodiment of the invention.

In order to create lines in the direction y according to the embodiment shown in FIGS. 2 and 3, the patterning device may be rotated by 90 degrees (or alternatively another patterning device or other part of the same patterning device may be applied), while during the irradiation, the substrate is moved along this y direction so as to extend the pattern along the y direction as shown schematically in FIG. 3. As illustrated in the enlarged, more detailed view of a part of the raster, each of the lines of the raster includes a plurality of substantially parallel lines, in order to achieve the response image as illustrated in FIG. 5a or 5b, as will be explained in more detail below. According to the invention it is not necessary for the second extended patterns according to FIG. 3 to extend exactly perpendicular to the first extended patterns.

The pattern may further be projected on the substrate while moving the substrate in the second direction so as to extend the projected pattern in the second direction, and this extended pattern may be measured along the second direction in order to measure the position of the extended pattern in the first direction. Thereby, deviations in both x and y direction may be detected and calibrated. In this manner a detection method is possible allowing detection of a relevant property in multiple directions and in particular a multidirectional calibration is possible.

An example of a formed pattern on a substrate W2 having non equidistant lines is shown in FIG. 9b. Substrate W2 is illustrated in FIG. 9b showing different extended patterns G11 and G22 that can be formed using a patterning device 30 having a pattern of points or rectangular shapes.

In an embodiment a substrate W2 as shown in FIG. 9b is formed, having multiple extending patterns. Group G22 comprises extended patterns of different lengths comprising in the shown embodiment four lines or eight lines. The extended patterns formed by four lines are equidistant. G22 further comprises double extended patterns comprising two groups of equidistant grid lines. The double extended pattern can be formed in two strokes or can be formed using a single pattern in the patterning device comprising similarly spaced points of two equidistant sets of points.

FIG. 9b further shows a group G11 comprising four groups of three extended patterns formed on the substrate W2. Group G11 comprises three extended patterns, extending in the x11 direction. Each of the extended patterns of group G11 can be formed using the same pattern of four points in the patterning device, moving the substrate table WT in direction x11 while irradiating the pattern M1, and moving the substrate table WT in order to form the second and third extended pattern of the group G11.

In another embodiment the pattering device comprises a set of three groups consisting each of four points. In this embodiment the complete group G11 is formed in a single stroke along x11 of the substrate table WT with respect to the patterning device MA. Such an embodiment is advantageous as the three extended patterns are formed during exposure each having the same or substantially the same errors, e.g., due to exposure grid errors in the positioning system. During measurement of a property of the extended patterns, three separate measurements can be performed for each of the extended patterns on said group. Although these measurements can each suffer from different positional errors, resulting from e.g., measure side grid encoder errors, the same exposure error is present in each of the extended pattern and a suitable filter (combination/convolution) can be used to extract the exposure grid errors from the recorded data. An example of such a technique is shown in U.S. Pat. No. 7,102,736 that is included by reference in its entirety.

Other groups within the G1 group can be formed in a similar fashion either by rotating the patterning device in order to position the group of points in the respective directions of the formed extended patterns or by rotating the substrate table. In an embodiment the patterning device 30 comprises the points extending in different directions such as group M1.

In another embodiment the patterning device comprises four groups of points arranged along a centerline extending in directions y11, y12, y13 and y14 according to FIG. 9b and the patterns on the substrate W2 are formed with rotation of the substrate table WT or patterning device MA.

In an embodiment groups of extended patterns on the substrate W are formed in a single operation in the expose stage of the lithographic apparatus. As the substrate W is exposed under the patterning device any errors in e.g., an encoding system for positioning the wafer table WT with respect to the patterning device are converted in errors of the extended pattern formed on the wafer and in the case of forming a group of extended patterns, in errors in these groups.

In an embodiment of a lithographic apparatus, during irradiation of the pattern onto the substrate, the substrate is moved, and a position of the substrate table is measured with a positioning device such as an interferometer, encoder-based or a photodiode (CCD) system. In an embodiment the substrate table is controlled by setting the position using the encoder/interferometer. As a consequence, inaccuracies, deviations in the encoder grid, in particular the expose encoder grid, may translate into deviations of the lines of the raster as created on the substrate. An example of such deviation of the line is depicted in the enlarged and schematic view in FIG. 3. As a result of moving the substrate table with respect to the patterning device and in particular without moving the patterning device, the extended pattern formed on the substrate will follow any errors which are caused by positional encoding errors during movement of the substrate table.

Figure 12:
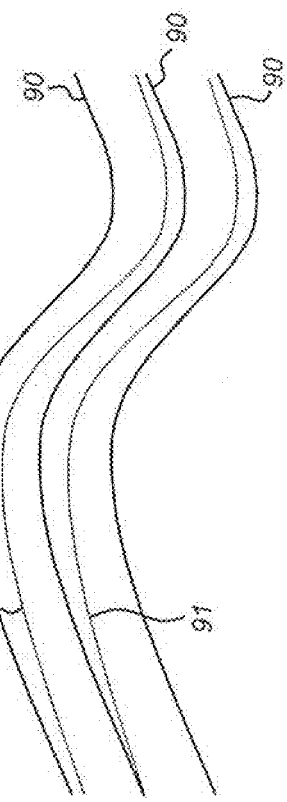
FIG. 12 illustrates schematically a further embodiment of a detail of an extended pattern.

In an embodiment the extended pattern of double gridlines G22 is formed in a single operation by illuminating M22 according to FIG. 9a. In another embodiment the double gridline pattern G22 is formed in two steps wherein first equidistant grid lines of a first group are formed and thereafter equidistant groups of a second group creating the double gridline extended pattern G22. A schematic detail of a double extended pattern is shown in FIG. 12.

In a first step, extended pattern 90 is formed. In a second step, possible at a very much later stage, the second extended pattern 91 is formed. As a result of a positional error (overlay error or stitching error) the gridlines of the second extended pattern are shifted.

G22 is an example of stitched marks formed using the extended pattern technique. By stitching two extended patterns an expose error can be measured continuously making all sorts of interpolations obsolete. This can be used for both calibration by printing two lines in each other and as maintenance test by stitching a second layer on a calibration substrate which already contains extended pattern(s).

In an embodiment the overlay pattern (second formed extended pattern) comprises the same equidistant lines. As a result of overlay errors however an extended pattern according to G22 is formed. In a subsequent detection method the shift of the second pattern with respect to the first pattern can be measured and subsequently corrected for.

In another embodiment, using a patterning device 35 according to the embodiment shown in FIG. 9d, the extended pattern comprising at least one line and in particular at least a few lines and, in an embodiment, grid lines, is formed using a patterning device comprising an image of the line, lines and/or grid lines. If the patterning device 35 is used repeatedly, lens heating can occur and the extended pattern formed on the substrate is formed as a result of the lens heating error, e.g., also showing deviations comparable to the deviations as shown in enlarged view of FIG. 3.

Within the scope of the invention, for any application an error resulting from any parameter relevant in the irradiation step can be translated onto the extended pattern formed on the substrate. Examples of relevant parameters are: substrate table properties such as positioning and relative positioning, but also illumination driven effects such as lens heating, reticle heating and wafer heating, dose control, focus during exposure. A further relevant parameter that could be measured/calibrated using the extended patterns according to any of embodiments is substrate clamping during exposure.

In an embodiment of the invention, any pattern may be applied to project and form the extended pattern(s) onto the substrate, such as a point, etc. Making use of the plurality of points spaced apart in a direction substantially perpendicular to the direction of movement of the substrate, a pattern of a plurality of parallel lines is created, which allows a highly sensitive detection by an alignment sensor, e.g., making use of interferometric detection principles or CCD camera techniques. Making use of the alignment sensor allows performing the calibration making use of existing and accurate sensors of the lithographic apparatus. Alternatively, other position sensing devices to detect the position of the line ((CCD) camera techniques) or parallel lines along its length may be applied.

In an embodiment a reference substrate is formed having a predefined set of extended patterns formed according to a predefined set of parameters, using e.g., combination of setting of a patterning device according to any of the above described embodiments. Such a substrate can be used for calibrating a lithographic apparatus.

In a further embodiment such a reference substrate can be exposed in a subsequent step forming further extended patterns. Further extended patterns can be formed on the reference substrate, and in a subsequent detection method and/or calibration method e.g., overlay errors can be detected and corrected for.

An extended pattern according to an embodiment extends in a first direction and can comprise two or more grid lines, but a single line can be an extended pattern within the scope of the invention too. A substrate can comprise multiple extended patterns. Further the one or more lines can have a varying width and/or can have actively generated deviations in a second direction, perpendicular to the first direction. A structure formed on the substrate is an extended pattern if it comprises at least one line extending generally in a first direction having a length of at least 35×, in a further embodiment at least 100×, in an even further embodiment at least 200× times the cross-sectional length of the line.

An extended pattern is in an embodiment created by illuminating a patterning device having points and moving the substrate table WT in the first direction.

In an embodiment the extended pattern on a substrate has a length in the first direction of close to the width of the substrate at that location.

In an embodiment a reference substrate W comprises at least two extended patterns extending in different directions and extending over a larger part of the substrate W.

A practical balance between calibration time and density of calibration data may be achieved when a raster having a pitch of substantially 8 micrometers or 0.5 millimeters is chosen, although other pitches may be suitable equally well depending on substrate size, calibration speed, specified accuracy, etc.

Forming Special Purpose Patterns

In an embodiment an extended pattern is used for obtaining a calibration map, in an embodiment, a two dimensional calibration map for a specific non XY-property of the lithographic apparatus such as z-grid calibration. Non-XY-properties are properties related to another aspect of the lithographic apparatus than primary positional properties such as X and Y coordinates as well as Rz positioning. An example of a non-XY-property is a secondary positional property such as Z-coordinate positioning.

In an embodiment a special extended pattern is formed in accordance to the method of forming an extended pattern in order to allow obtaining such a calibration map for the desired property. The special extended pattern is formed using a specific step to allow measuring the desired property. A specific step can be an additional step in the method for forming the extended pattern, such as adding a wedge during exposure or a particular pattern for forming the extended pattern, as will be explained in detail hereunder. In some embodiments similar measurement steps as with respect to a 'normal' extended pattern allow measuring the special parameter.

In an embodiment a special measurement tool is used to detect a parameter related to the desired property. In both embodiments the extended pattern allowing detection of a special, non XY-property, can be formed using embodiments or combinations of features according to any of the steps disclosed herein. The special property can be a focus parameter such as Z or Rx or Ry.

In an embodiment the formed extended pattern can comprise focal mark properties which will allow a single shot focal method. A single shot focal method is known from U.S. application No. 60/996,506, said document incorporated by reference in its entirety herein.

Figures 13A, 13B, 13C:
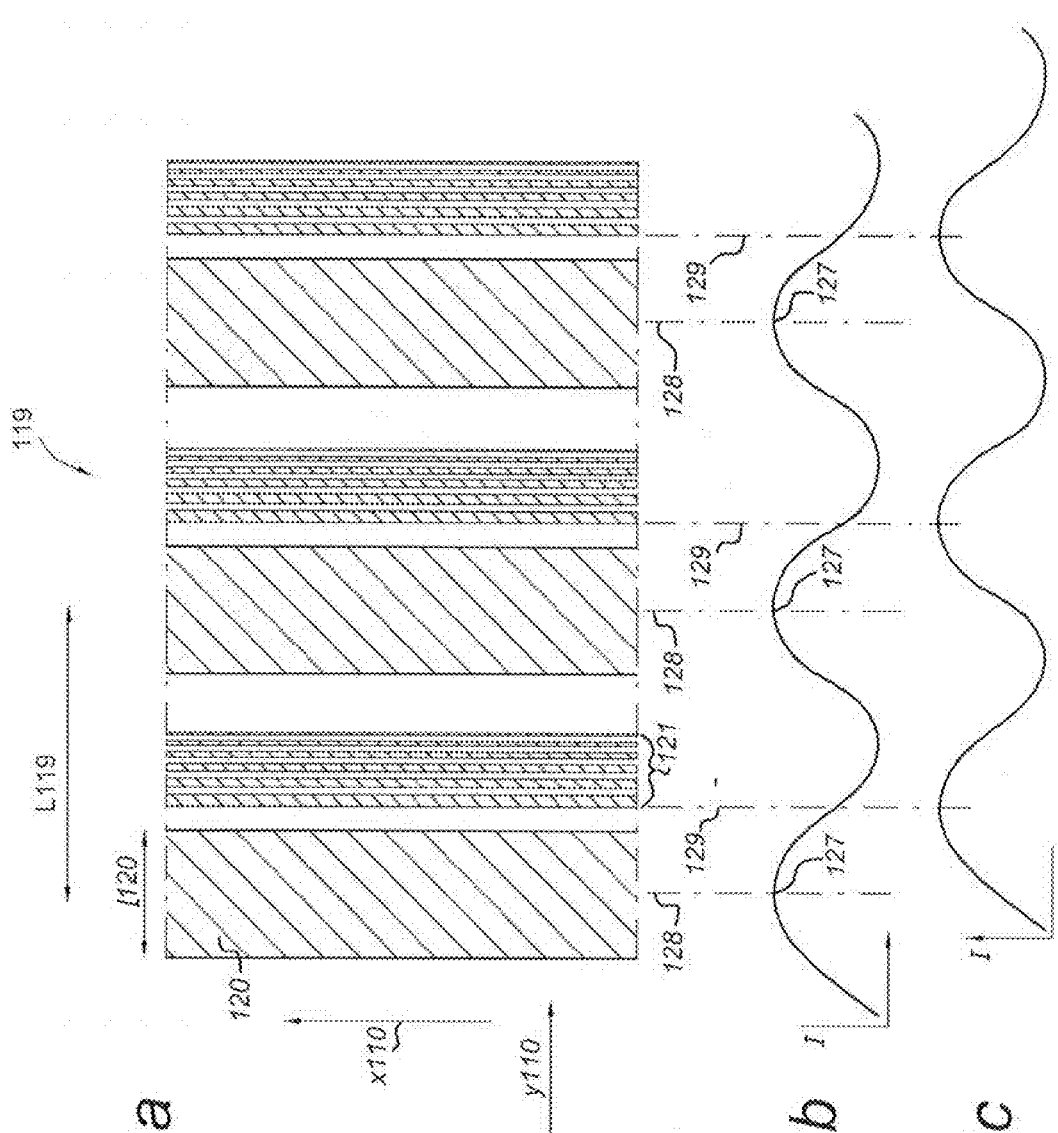

In an embodiment, shown in FIG. 13a, the extended pattern 119 comprises a main line 120 and several adjacent fine lines 121. In this embodiment of a special extended pattern, the main line 120 and fine lines 121 extend in the first direction x110 and are formed using a suitable patterning device, while moving the substrate table during illumination. The special extended pattern can extend over a large part of the substrate. The special extended pattern is formed using any of the disclosed methods or equivalents thereof.

The fine lines 121 have a smaller width than the main line, the width extending generally in the second direction, here y110. In an embodiment the main line 120 has a width L120 in the order of 5 μm, specifically 5.8 μm, while the fine lines 121 have a width in the order of 20-1000 nm, in an embodiment 40-600 nm and in a specific embodiment 50-400 nm and specifically 0.2 μm. The number of fine lines is four to thirty, in an embodiment ten to twenty, specifically eighteen. A combination of a main line and one or more adjacent fine lines shall be referred to as a focal mark unit. In an embodiment a focal mark unit comprises several main lines 120. In an embodiment the unit of a main line and fine lines is formed in a pattern ten to thirty times adjacent one to another, specifically seventeen times.

The extended pattern can comprise two or more adjacent focal mark units. The focal mark units extend in the first direction, the direction of movement of the substrate table during exposure. The focal mark units can extend over a large length in said first direction, e.g., at least 40×, in an embodiment at least 80× the width of the focal mark unit.

The focal mark unit, comprising main lines and per main line several adjacent fine lines, can have a width L119 in the order of 5-50 μm. In the formed special extended pattern the width extends in the second direction. In an embodiment the extended pattern comprises several focal mark units parallel and next to each other at equal mutual distance in the second direction, a direction generally perpendicular to the first direction of the extended pattern. In the embodiment according to FIG. 13a, the mutual distance L119 between the units in the second direction can be 10-50 μm, in an embodiment, about 15-20 μm.

During exposure, the main line 120 is formed generally independent of focus, similar to known marks used in the art. The main line 120 having a size that is generally large with respect to the resolution of the lithographic apparatus is an example of a standard alignment structure.

The fine lines 121 however are examples of focus sensitive marks that are formed during exposure dependent on the focus of the exposure. If the exposure is out of focus, the fine lines 121 are formed, if any, only partly. The fine lines can have a width in the order of the desired resolution of the lithographic apparatus.

Finer lines will be more sensitive to focus. The better in focus, the more fine lines will be formed. The width of formed fine lines is an indication of the local focus during exposure. In an embodiment a set of fine lines of different widths will allow in a subsequent measurement step obtaining a parameter related to the local focus.

In an embodiment fine lines 121 comprise a set of lines that have different line widths. In an embodiment the adjacent fine lines in such a set are positioned next to each other in an order having an increasing or decreasing line width. With decreasing line width, the fine lines 121 become more sensitive to focus. The focus sensitivity is measurable e.g., by measuring diffractive properties, as will described in detail hereunder.

An extended pattern comprising several focal mark units having lines extending in the first direction and positioned adjacent to one another in the second direction, will result in a diffractive pattern in the second direction, wherein the position of maximum intensity of the diffractive pattern will depend on the local focus, especially of the formed fine lines. The diffractive properties can be measured and used to create a calibration map.

A focal mark unit can be formed using a patterning device having suitable points therefore, wherein the substrate is moved in the first direction, the points formed adjacent to one another in the second direction.

In this embodiment the patterning device can comprise a collection of focal mark units, wherein in the embodiment according to FIG. 13*a*, each focal mark unit in the patterning device comprises one main point and several fine points, the points positioned adjacent to one another in the second direction. Other focal mark units are also possible. The fine points can be points of different size, in particular of different width in the second direction. During exposure and subsequent movement of the substrate table in the first direction, the points will illuminate a pattern extending in the first direction, forming a focus sensitive extended pattern.

Figure 15:
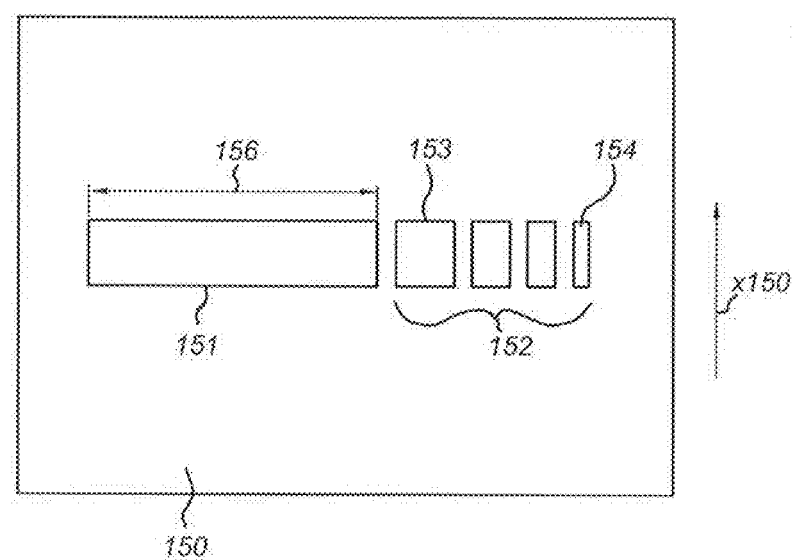
FIG. 15 illustrates a further embodiment of a patterning device.

An example of a patterning device for forming a single focal mark unit is shown in FIG. 15. Patterning device 150 is shown having points 151 and 152 for forming the main line 120 and fine lines 121 respectively during illumination and similar moving of the substrate table WT in the first direction, in FIG. 15 indicated with. x150 Main point 151 has a width 156 for forming a main line 120 having the desired width. Points 152 have a width extending in the second direction for forming the desired fine lines having smaller widths.

Fine point 153 has a larger width than fine point 154. Although four fine points 152 are shown, it will be clear that more points are possible.

In an embodiment fine points 152 and especially fine point 154 extends more in the first direction x150 than in the second direction allowing a longer illumination of the substrate during exposure. Due to a longer length in the first direction than in the second direction, the relevant part of the substrate will be exposed for a longer time. This can enhance the forming the fine structures.

The embodiment of an extended pattern according to FIG. 13*a* is an example of a focus sensitive extended pattern comprising a single focus sensitive grating. Such a single grating can also be used for read-out in a special measurement tool, such as a scatterometry system. Within the scope of the invention lie further embodiments known by the skilled man of single focus sensitive gratings applied to a substrate according to the method of forming an extended pattern, allowing focus measurement and subsequent calibration.

Figure 13D:
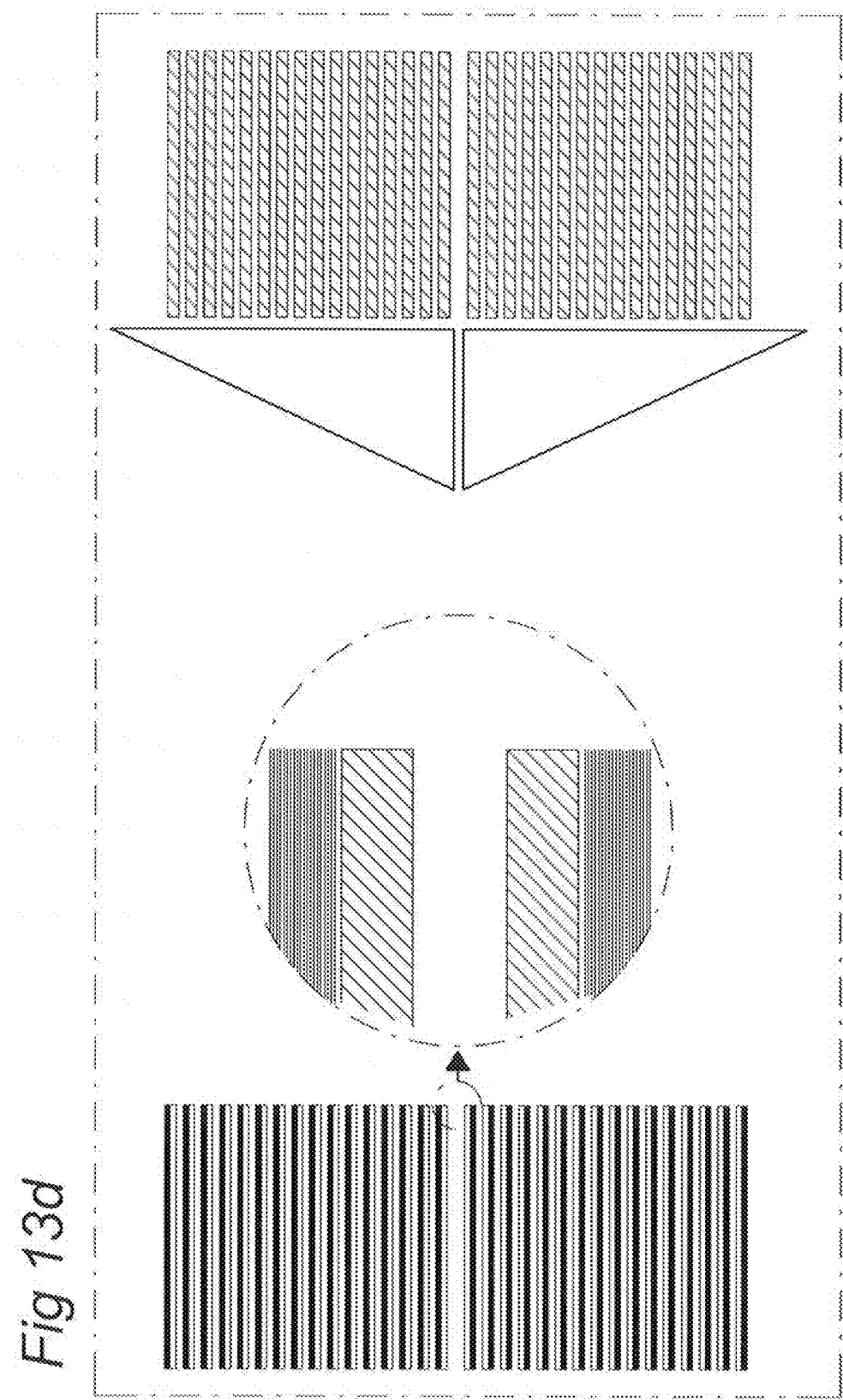
FIG. 13d illustrates another embodiment of embodiments of focus sensitive marks that can be used as a basis for an extended pattern.

Another example of a focus sensitive extended pattern is a pattern comprising a mark having a wide line in combination with fine lines such as FOCAL marks (partially chopped lines), see FIG. 13*d*, left hand side, or a pattern comprising PreFoc/LVT marks. A PreFoc/LVT mark can be a standard alignment mark (for extended patterns points in the patterning device) illuminated by non-telecentric light created by wedges on top of the mark on the patterning device. A pattern of PreFoc/LVT marks is illustrated in FIG. 13*d* on the right hand side. A patterning device as described above can be used in a similar fashion to form the extended mark. As a result of the wedge the extended pattern will be focus sensitive. The formed focus sensitive extended pattern can have a negative or positive sensitivity.

An example of simple FOCAL marks and of LVT marks are illustrated in FIG. 13*d*. FOCAL marks are shown on the left-hand side comprising multiple sets of a focal mark unit formed by a wide line and fine lines. Two focal mark units are shown in detail in the encircled part. The first direction extends in the direction of the lines, in the figure from left to right.

Using the patterning device having a suitable pattern and moving the substrate while exposing the pattern can be used to form an extended focus sensitive pattern, wherein focus sensitivity results in a XY displacement. As a result of 'bad' focus, the extended pattern formed using a point or another similar shape in the patterning device, will show displacement.

In an embodiment focus sensitive extended patterns are formed in two generally perpendicular directions on the substrate. This allows obtaining Z calibration, as well as Rx and Ry calibration.

In an embodiment a focus sensitive exposure of a patterning device results in an extended pattern extending in the first direction and having focus sensitive displacement in the second direction. In an embodiment, the focus sensitive displacement is in the second direction only. However this is not necessary.

Figure 14A:
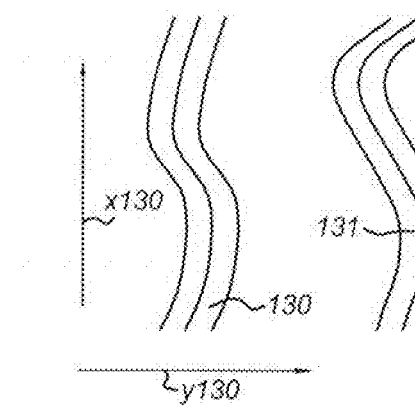
FIGS. 14a and 14b illustrate schematically embodiments of focus sensitive extended patterns.

In an embodiment a focus sensitive extended pattern is formed in combination with a standard extended pattern. In an embodiment the different extended patterns are formed in a single operation, during the same movement of the substrate table in the first direction. FIG. 14*a* illustrates schematically an extended pattern having a standard alignment extended pattern 130 and a focus sensitive extended pattern 131.

Focus sensitive extended pattern 131 formed on the substrate is positioned as a result of a combination of errors during exposure. Similar to the 'normal' extended pattern 130, the focus sensitive extended pattern extends generally in the first direction x130 and will show displacements in the second direction y130 as a result of grid errors or other causes. Further focus sensitive extended pattern 131 is displaced at least partially in the second direction y130 as a result of focus errors. As a result of height variations (z-direction in a xyz coordinate system for a substrate table), the focus sensitive extended pattern will show additional displacements. The additional displacement can be measured with respect to the 'normal' extended pattern 130 and can be filtered out, resulting in a calibration map for height variation and exposure calibration.

Figure 14B:
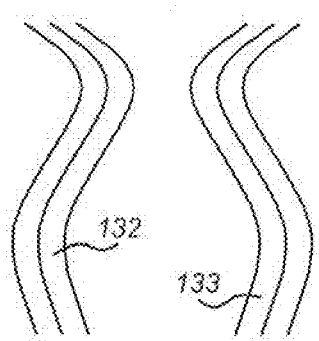

FIG. 14*b* illustrates schematically an extended pattern comprising two focus sensitive extended patterns 132 and 133, wherein the extended pattern 132 has a negative focus sensitivity and pattern 133 has a positive sensitivity. Both patterns may be formed in a single operation. Any focus errors will be shown mirror symmetrically with respect to the halfway line in between the adjacent extended patterns, while XY-encoder errors result in a similar shift in both extended patterns.

The focus sensitive extended patterns can be formed in at least two directions over the surface of the substrate similar to the embodiment shown in FIG. 3. This will allow to obtain a two dimensional map for focus calibration of the substrate.

Repeating Forming the Extended Pattern

In an embodiment of a method for calibrating the method comprises forming multiple extended patterns in subsequent runs. An extended pattern is formed several times. In an embodiment the same extended pattern is formed multiple times. The same extended pattern is formed using a patterning device with a similar arrangement. A similar set of points in the patterning device is used repeatedly.

In a further embodiment a special purpose extended pattern is repeatedly formed in subsequent steps of the method. This will allow obtaining a measurement results for each of the multiple extended patterns and will allow repeating a calibration and in particular averaging calibration results for obtaining better results.

In a further embodiment the repeated steps for forming the extended pattern are performed under slightly different circumstances, in particular with a different lithographic apparatus set up. Different setup parameters for the lithographic apparatus can be used while forming a similar extended pattern. In an embodiment, the same extended pattern, using the same patterning device is repeated under different set up parameters. In an embodiment, several, e.g., ten, extended patterns are formed adjacent to each other, The formed extended patterns can be formed with different Z set up. The height parameter of the substrate table is adjusted using the set up modules of the lithographic apparatus such that the substrate table WT is arranged at different heights during exposure and subsequent moving of the substrate table during exposure. This allows forming extended patterns formed with different setup parameters and allows obtaining a more specific calibration for a parameter.

Repeating forming a special purpose extended pattern may be combined with variations in the set up of the parameter to be calibrated with the special purpose extended pattern. By varying Z during different exposures of extended patterns, these extended patterns are formed under different Z setup circumstances and these extended patterns will allow measuring the results of the different setup circumstances. When e.g., LVT marks are formed, the shift of the resultant LVT mark extended pattern will differ as a result of the varying of the Z set up. This allows further detailed setup tuning/calibration of the lithographic apparatus.

In an embodiment the extended patterns formed using these repetitive steps for forming the extended patterns at different positions with different setup, can be regarded as calibration fields. Further these extended patterns formed with different setup allow obtaining an improved relation between the readout and the parameter to be calibrated, in a specific embodiment between a horizontal shift and the Z, Rx and Ry parameters.

An Extended Pattern on the Substrate Table

In an embodiment an extended pattern is formed and positioned on the substrate table. This allows direct detection of a property of the extended pattern and therefore of the substrate table WT. The extended pattern can be formed on a substrate that is positioned onto the substrate table outside the supporting device for support the substrate. The substrate (table) W(T) comprises the extended pattern(s) as reference marks.

The extended pattern on the substrate table can be (or was) formed using any of the techniques described above.

In an embodiment the extended pattern on the substrate table is formed in an operation after installing the lithographic apparatus at its operation facilities. The extended pattern can be used for maintenance during operation. The extended pattern can be used for on-site calibrations, in particular positional calibrations.

Extended patterns on the substrate or on the substrate table formed according to any of the described methods are in an embodiment of a detection method scanned along the first direction of the extended pattern. Before scanning auxiliary steps for improving said scanning can be performed and will be discussed now.

Exposure Modulation

In an embodiment the extended pattern is formed onto the substrate generally extending in a first direction. The extended pattern may be formed having a modulation. The pattern extends generally in the first direction and a modulation is superimposed in the second direction. Applying a known modulation to the pattern can be used for noise reduction. Applying a known and predetermined signal to the substrate table also reduces noise in the measured signal. Since the modulation is known it can be removed from the signal. In an embodiment a reciprocal movement in the second direction is provided during the forming process of the extended pattern.

The extended pattern is formed on the substrate by moving the substrate table along a first direction, that could be generally parallel to a direction of movement of a long-stroke or short-stroke module or generally parallel to an axis of the global wafer stage coordinates system. In a further embodiment simultaneously a modulation is superimposed onto the extended pattern by simultaneously moving the substrate table in the second direction perpendicular to the first direction. Said moving in the second direction can be the result of operating a second set of long-stroke and short-stroke modules.

In an embodiment the modulation can be a regular pattern such as a sinus wavelike pattern. The modulation can have an amplitude of, for example, at least 0.5 of the distance between the grid lines of the extended pattern. In an embodiment the modulation has a larger amplitude. The modulation can have a wavelength extending in the first direction, which wavelength may be more than 10× the size of the grid line pattern.

In an embodiment the modulation in the second direction is provided by operating the short-stroke module for moving the substrate table only.

Since a known modulation is superimposed onto the extended pattern, during subsequent measurements of the extended pattern, said modulation can be accounted for in the measurement signal and can subsequently be corrected for, resulting in noise reduction.

Further reference is made to the above discussion of FIG. 9d for another example of exposure modulation.

Forming Auxiliary Elements

Further to forming the extended pattern on the substrate, alignment marks can be formed on the substrate by using any of the known techniques. In an embodiment alignment marks are provided on the substrate prior to forming the extended pattern.

Alignment marks, at least two, in an embodiment at least ten, are formed on the substrate and allow aligning the substrate in a certain position with respect to a zero position. Aligning the substrate is a known method and uses the formed alignment marks on the substrate. From the aligned position, it is possible to irradiate and form the extended pattern onto the substrate at a known location. In subsequent steps of the method the relative position of the extended mark with respect to the alignment marks is known and can be used for locating the extended pattern.

In an embodiment the extended pattern and alignment marks are formed in a single operation at the expose side of the lithographic apparatus. In an embodiment the alignment marks and the extended pattern are formed on the substrate in a single image exposure step. Both the extended pattern and alignment marks are developed in a single step. Any positional encoding errors in the alignment marks will be present in the alignment marks and similarly in the extended pattern.

In a further embodiment both the alignment marks and the extended pattern are projected onto the substrate by moving the substrate table to respective positions. The positioning of the extended pattern is only a relative positioning with respect to the alignment marks. In fact the extended pattern is formed at an undefined position with respect to the alignment marks. This allows forming the extended pattern in a single step together with the alignment marks. Any correction for positional errors are detected and/or measured and/or corrected for in a subsequent detection step and/or calibration step.

In an embodiment at least two or more marks are formed near a begin location and an end location of the extended pattern. These marks will be referred to as extended pattern alignment marks. These marks can be used to align the extended pattern formed on the substrate, before any of the properties of the extended pattern itself are measured. The marks are positioned parallel to the extended pattern. The skilled person will be able to provide different techniques for aligning the lithographic apparatus with the extended pattern formed on the substrate held on the substrate stage.

In an embodiment the extended pattern alignment marks are positioned at one or on both sides along the extended pattern on the substrate. In an embodiment the extended pattern alignment marks are formed directly in line with the extended pattern. Such a position is shown in FIG. 6.

Figure 6:
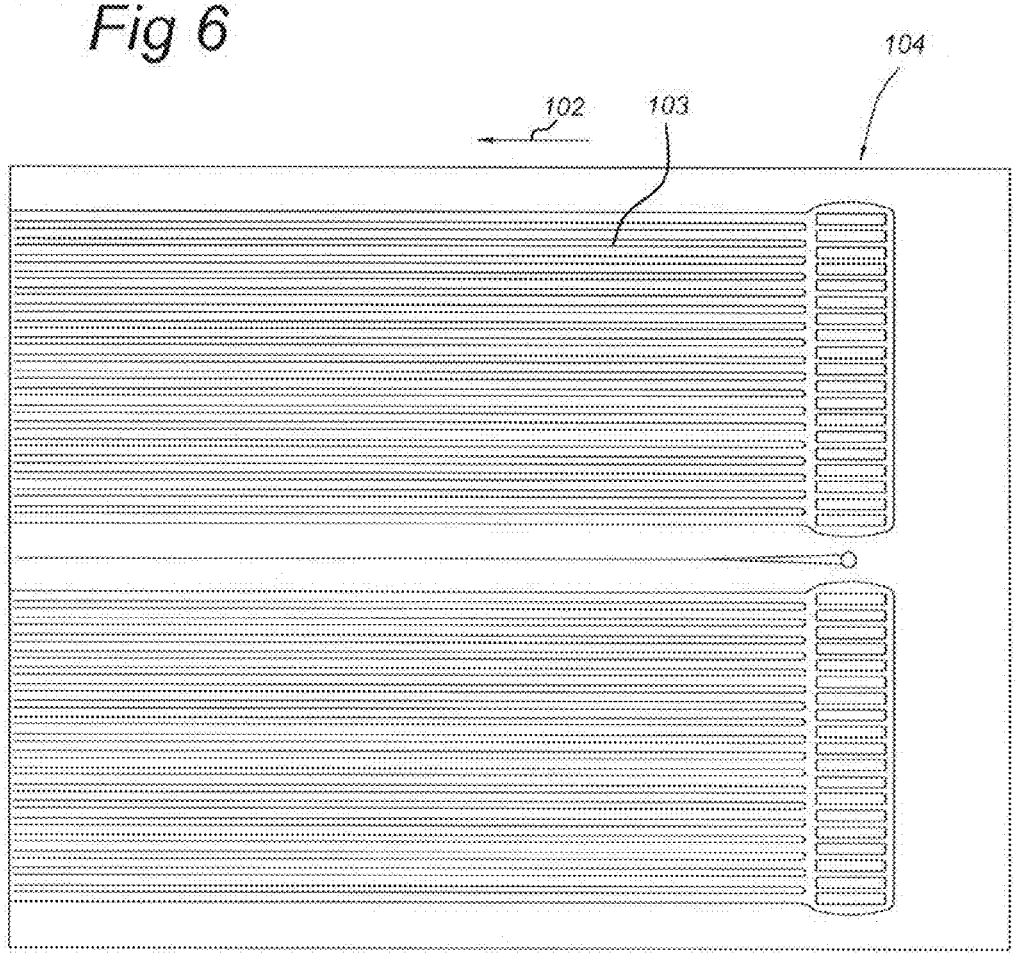
FIG. 6 is a microscopic image of an end section of an embodiment of the extended pattern and an alignment mark.

FIG. 6 shows an end section of an extended pattern 103, wherein marks 104 are formed on the substrate as extended pattern alignment marks. In a coarse substrate alignment step, an alignment device of the lithographic apparatus can measure the position of the marks 104 at both ends of the extended pattern 103 and align the substrate in order to scan the extended pattern along the first direction 102.

Figure 7:
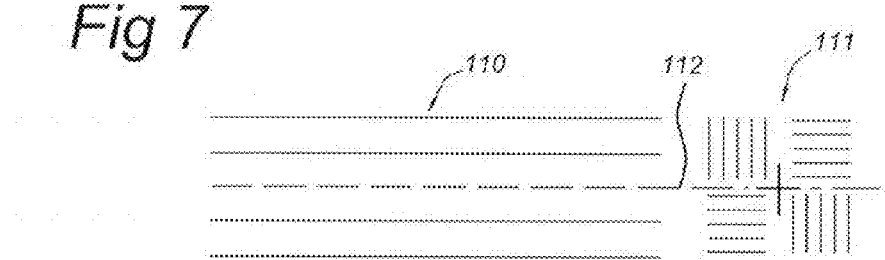
FIG. 7 illustrates an end section of an extended pattern according to another embodiment.

In an embodiment extended pattern alignment marks are positioned near an end section at a position near the extended centerline of the extended pattern as shown in FIG. 7. In an embodiment, a zero mark 111 is used as extended pattern alignment mark. Using an alignment measurement scanning both extended pattern alignment marks 111 at both ends of the extended pattern 110, two positions are obtained. A 'straight' line 112 between the positions can indicate a centerline of the extended pattern 110.

In an embodiment multiple zero marks are formed on the wafer close to the extended pattern. In an embodiment sets of two or more marks are formed to indicate positions or another property of the extended pattern. In an embodiment an extended pattern alignment mark indicates an off-center position of the extended pattern. In an embodiment the off-center position corresponds with the position of one of the two near peak zero crossings for performing a flank scan according to an embodiment of the invention as will be explained hereunder in more detail.

Pre-Measurement Steps (Alignment)

In an embodiment the method of detecting a property of the extended pattern comprises first aligning the substrate and the extended pattern. Aligning comprises at least finding suitable relative positions of the extended pattern and an alignment sensor for performing the measurement along the first direction. The substrate can be provided with auxiliary elements, such as marks, for helping to determine the relative positions of the extended pattern and/or the substrate table with respect to a sensor in a first and/or second direction.

In an embodiment detecting/measuring a property of the extended pattern formed on the substrate (the actual measurement scan) can be preceded by moving the stage to a 'zero' position and subsequently performing a stage align and/or a global substrate align. In an embodiment a coarse wafer align step is used to capture the substrate. After coarse wafer align, the substrate grid is known accurately enough to predict all marks positions for fine wafer align. Such alignments are particularly advantageous if the substrate is loaded from a loading station onto the substrate table with low accuracy. Thus all steps until loading can be performed at relatively low accuracy (at high speed and/or at low costs). During the fine wafer alignment step, the marks are measured to determine the direction/position of the extended pattern with high accuracy. Determining the first direction is used to generate a coordinate system such that movement of the substrate table along one of the axis of the coordinate system corresponds with the first direction of the extended pattern.

Rotation of the substrate table WT and the substrate may be used to find the first direction of the extended pattern.

In an embodiment the substrate is scanned for auxiliary marks such as the extended pattern alignment marks. In an embodiment zero marks are positioned at extended centerline positions on both ends of the extended pattern, and positions thereof are collected during a quick scan of the wafer, in particular at the measure side of the lithographic apparatus. Positions of the zero marks can indicate/provide much information with regard to the position, the direction and the properties of the extended pattern. The information is collected and processed in subsequent steps in an embodiment of the method according to the invention.

Extended pattern alignment marks can provide a position of a centerline of the extended pattern, or an off-center position. The marks can indicate properties of the modulation in the extended pattern, such as information with regard to the wavelength or amplitude of the modulation.

In an embodiment of the invention, a prescan or alignment scan of the extended pattern is performed in the second direction. This prescan is used to determine the position of the extended pattern in the second direction. A combination with a second prescan at a different position in the first direction is used to determine the first direction with increased accuracy.

The prescan relates to a physical parameter of the extended pattern in the second direction. In an embodiment the parameter is detected by moving in a direction deliberately comprising a component in both the expected first and second direction. This is advantageous as scanning at a relatively large angle to the expected first direction will ensure that the position of the extended pattern is found in both the first and second direction with only one scan. With only one scan needed, this is a relatively time efficient method.

Both in this prescan as well as in the actual measurement scans (such as the flank scans), the detected property (intensity) may be measured because the extended pattern comprises a set of gridlines protruding towards the alignment sensor. In an embodiment the alignment sensor is of the diffraction based type and the gridlines can be seen as a grating.

Flank Scan Positioning

A method according to an embodiment of the invention involves detecting a property of the extended pattern using an alignment sensor of the lithographic apparatus. In an embodiment a property of the extended pattern, extending in the first direction, is measured along the first direction of the extended pattern. To measure along the first direction the substrate table is moved in the first direction thereby changing the relative positions of the alignment sensor and the extended pattern.

In an embodiment, the measured property, such as intensity of diffracted radiation, is directly related to a physical property of the extended pattern, and in particular to a physical property of the extended pattern in the second direction. The method allows measuring a physical property of the extended pattern linked primarily to a position along the extended pattern in the first direction.

Figure 4:
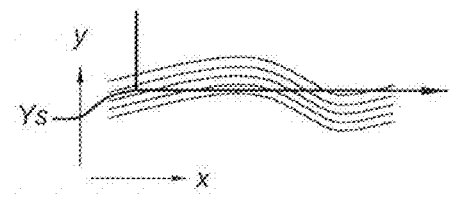
FIG. 4 illustrates the measurement along the pattern projected onto the substrate illustrated in FIG. 2.

The scanning of any embodiment of the extended pattern formed on the substrate comprises detection of a property along a first direction of the extended pattern. The scanning is performed along a generally straight line positioned at a reference position of the relative positions in the second direction of the sensor and the extended pattern. In FIG. 4 an example of such a line is illustrated and the reference position in the second direction is indicated with $Y_s$. The positions may be referenced to a center point of a camera image formed in the alignment sensor.

As a further pre-measurement step the extended pattern is positioned such that a desired output of the alignment sensor is achieved which corresponds to the measurement beam of the alignment sensor reaching substantially a center of the parallel lines or the near peak zero crossings ZC1 and ZC2, as outlined in more detail later in this document.

In an embodiment, firstly, the substrate is positioned such that a measurement beam of the alignment sensor interacts with the extended pattern (parallel gridlines) formed on the substrate or substrate table according to e.g., FIG. 3, that is: the diffractive properties of the pattern are used and may be measured. This may be performed by moving the substrate (stage) in the second direction, as schematically indicated in FIG. 4, in an embodiment, perpendicular to the first direction. The second direction can be generally parallel to the second long-stroke and short-stroke module for moving the substrate table with respect to the reticle and/or the mainframe of the lithographic apparatus.

The alignment scan may be performed by moving the substrate table in the second direction, or at least a movement having a component in the second direction. Simultaneously in an embodiment a position encoder or interferometer provides to link the obtained diffractive pattern to a position on the substrate/of the substrate table.

In an embodiment the substrate comprises multiple extended patterns extending in the first direction located at different positions in the second direction. In an embodiment these extended patterns are formed in parallel. In a single stroke in the second direction, diffractive patterns for these multiple extended patterns can be obtained. In this manner the alignment data scan in the second direction is performed more quickly for these multiple extended patterns.

A response curve of the alignment sensor output signal along the second direction, i.e., a direction perpendicular to the extended pattern (i.e., the sensor signal along direction y in FIG. 4) is depicted in FIG. 5a. As can be seen in FIG. 5a, a peak maximum output signal is obtained, which occurs when the alignment sensor is aligned with a centre of the parallel lines. Moving from this centre towards an outside edge of the parallel lines, a spatially periodic pattern is obtained alternately providing peak maximum output signals and peak minimum output signals due to interference effects.

The illustrated example of FIG. 5a shows a response for a grid pattern of only a few grid lines. In an embodiment, an extended mark having more than 10 grid lines is used. In this embodiment, the periodic structure will show less damping and will have more stable peaks. This is advantageous as finding the maximum peak is less relevant.

In an advantageous embodiment the detection method records a physical property along the first direction of the extended pattern that is the result of a physical parameter along the second direction. In this example the recorded property along the first direction can be the intensity resulting from the diffractive property of the extended pattern along the second direction. The diffractive property is most sensitive on the flanks of the intensity profile over the second direction (maximum slope=maximum sensitivity) as the derivative of the intensity to the y position (second direction) is highest at the flanks. Further on it will be assumed that the measured intensities are pre-processed so that the peak minimum intensities are registered as negative peaks and the peak maximum intensities are registered as positive peaks so that the flanks of the intensity profiles comprise zero crossings (FIG. 5a). The diffractive property is particularly sensitive at the near peak zero crossings ZC1 and ZC2 adjacent to the position of peak maximum output. This is because at the position of peak maximum output the largest number of parallel lines contributes to the intensity at the peak, giving the peak value, whereas the zero value at the crossing obviously remains the same. The distance between the peaks and the zero crossings is constant.

According to an embodiment, the measurement is preceded by positioning the substrate in the direction perpendicular to the lines as close as possible to either of the near peak zero crossings (ZC1, ZC2) which thus serve as reference positions. Thereby, a maximum sensitivity in the direction perpendicular to the lines may be obtained, as a slope of the response curve may be maximal at this point. Any errors in the formed extended pattern as a result of encoder errors, such as the deviation of the extended pattern in the second direction as shown in FIG. 2, may be measured at this position with largest accuracy. Hereinafter the scanning position in the second direction $Y_s$ formed by the near peak response zero crossing positions will be referred to as 'flank scan' positions.

In an embodiment of the extended pattern comprising more than seven gridlines, such as the example according to FIG. 6, a prescan result similar to FIG. 5b will be obtained. Here the damping of the peaks of the diffractive pattern is less visible. Here any of the shown zero crossings ZC10, ZC11, ZC12 and ZC13 can be taken as a reference position in the second direction for subsequently performing the measurement along the extended pattern in the first direction. If a second prescan/flank scan is performed, the second scan should be performed at/near a zero-crossing having an opposite slope. Examples of possible combinations are ZC10 and ZC11 and ZC10 and ZC13.

In a further embodiment the scan in the second direction provides data with respect to Automatic Gain Control settings. These settings can be saved and used for signal control. In the embodiment, the extended pattern is scanned in the second direction. During the scan the alignment sensor will output an electrical signal corresponding to the measured intensity. This electrical signal is used to determine the gain of amplifiers in the alignment sensor during the actual measurement scans in the first direction which will be performed later. The gain is determined so that the signal does not clip at maximum intensities, giving maximal Signal to Noise Ratio when the intensity is at its minimum (zero) and maximum sensitivity. In an alternative embodiment the gain is determined by scanning over a fiducial. The fiducial comprises a fiducial marker. The fiducial and fiducial marker are produced so that the maximum and minimum intensities are higher respectively smaller than the intensities expected during the actual measurement scan in the first direction which will be performed later. The gain is determined so that the signal does not clip at maximum intensities, giving maximal Signal to Noise Ratio and maximum sensitivity.

In order to construct an intensity versus position signal, intensities of the alignment beam measured by the alignment sensor and the position of the substrate table are sampled at exactly the same time. The synchronization between position and intensity sampling is implemented by a trigger scenario. In an embodiment a metrology device of the lithographic exposure apparatus comprises an alignment tool that receives a synchronization signal and a scan state signal from a synchronization driver. During the scan intensity samples are measured and position samples are received from the positioning system. Intensity samples and the positioning samples should be combined. To reduce the influence of the acceleration overshoot, a time delay is inserted before the position/light-sampling starts. This delay is denoted as "Vc_settling" or constant velocity setting.

In an embodiment using an alignment sensor based on diffraction orders, the peak-peak signal is maximized for the highest order (i.e., 7th order) to further improve accuracy. In an embodiment the peak-peak signal is maximized for each detected order. This makes the stage much more sensitive to stage positioning.

In an embodiment an automatic gain setting is performed before each detection of the extended pattern along the first direction. This allows correcting gain settings for each scan along the first direction.

In an embodiment the extended patterns contain an amount of patterns such that the complete set of extended patterns will fit into the numerical aperture of an alignment sensor, for example in a CCD sensor. The image of the pattern will then result in a periodic (sinusoidal) signal. Then it will be possible to perform a periodic (sine) fit while scanning in the second direction.

In an embodiment one or multiple extended patterns are read out at the same time. This enables calibration updates and maintenance features. These marks should fit within the numerical aperture of the alignment system.

Measuring Along the Extended Pattern

In an embodiment, after a prescan such as a first alignment and/or an alignment data scan, the extended pattern is scanned generally along the direction of the lines of the extended pattern, that is generally along the first direction (x direction according to the embodiment explained using FIG. 4). In an embodiment the substrate table is moved in x direction. Thereby, any deviations of the parallel lines, such as depicted in the enlarged view of FIG. 3 as well as in FIG. 4, will result in a change in the output signal of the alignment sensor (as the alignment beam position varies according to the arrows at the center peak in FIG. 5a). The output signal of the alignment sensor now provides a continuous signal along the parallel lines providing information about any deviations in the parallel lines in a direction perpendicular to it. A cause of these deviations of the lines may be found in errors of the encoder grating (i.e., the encoder target). Calibration of the encoder stage position measurement system can be performed using the alignment sensor output signal as will be explained later in this document.

Furthermore, by making use of a plurality of extended patterns (e.g., the raster depicted in FIG. 3), a plurality of measurements at relatively short mutual distances is obtained, which may reduce interpolation errors that would be obtained when attempting to interpolate between mutually more distant calibration points according to the conventional stitching approach. By performing this calibration technique for a plurality of extended patterns along the raster, the calibration can thus be performed for a plurality of positions of the substrate stage, and can be performed in both x and y direction by making use of both directions of the raster.

In an embodiment a scan of the extended pattern along the first direction comprises moving the substrate table using one of the long-stroke and short-stroke modules, and 'locking' the other long-stroke and short-stroke module in the second direction.

In an embodiment the substrate table is positioned at the scanning position in the second direction y, and moved using the first long-stroke and short-stroke module to a position beyond the extended pattern formed on the wafer.

For scanning the extended pattern along the first direction, the substrate table is accelerated from its starting position in the first direction and in an embodiment the substrate table is brought to a stable scanning velocity in the first direction while maintaining the second coordinate at the locked position. The scanning speed in the first direction is, in an embodiment, over 100 mm/s, and, in a particular embodiment, over 200 mm/s. In an embodiment using a near maximum velocity of the long-stroke module, speeds of over 250 mm/s and 290 mm/s can be obtained. This will allow scanning the extended pattern in the first direction, said extended pattern being formed over a larger part of the substrate, e.g., 300 mm, in about 1 second. In prior arrangements a line of marks having a similar length, would consist of 300 marks with a 1 mm pitch and would have taken at least 15 seconds for only the scanning part of the movement. This is because each mark would be scanned separately, each time involving a settling time wherein the velocity of the substrate table stabilizes before measurements start. In between scans the substrate table would be stepped to a starting position for a next measurement scan. Switching between stepping and scanning consumes valuable time. A time saving of over 90% is obtained.

In an embodiment of a discontinuous extended pattern (i.e., an extended pattern wherein the lines for instance are built up of several separate features), it is possible to detect at non stable velocities. Further if the discontinuous extended pattern was formed using changing dynamical properties as indicated in embodiment discussed above, these different dynamical properties are detectable when scanning the discontinuous extended pattern.

While moving the substrate table at a stable velocity in the first direction, in an embodiment data is collected using the alignment sensor resulting in a data scan of intensities along the first direction with respect to a diffractive property of the extended pattern, in an embodiment, the intensity of a diffraction order.

In an embodiment in one scan along the extended pattern, multiple diffraction orders are measured. By way of example, fifth and seventh diffraction orders may be measured. Obtaining data with respect to multiple orders in a single scan allows interpolation of measured results and in some embodiments a noise reduction can be obtained. Diffraction orders generally behave the same with respect to substrate reflectivity (such as wafer reflectivity). As the substrate reflectivity increases the intensities of the orders also increases.

After reaching an end section of the extended pattern in the first direction, the substrate table is decelerated. The obtained data is saved in a register of the lithographic exposure apparatus. In an embodiment it is pre-processed in order to prepare the data for further processing. Pre-processing may incorporate subtracting a constant value from the intensities (so that peak minimum intensities are represented as negative intensities).

The alignment signal depends on the spatial position of the mark underneath the optical module of the alignment sensor. Scanning in the first direction of a perfectly straight extended pattern results in a dc-signal.

Figure 10:
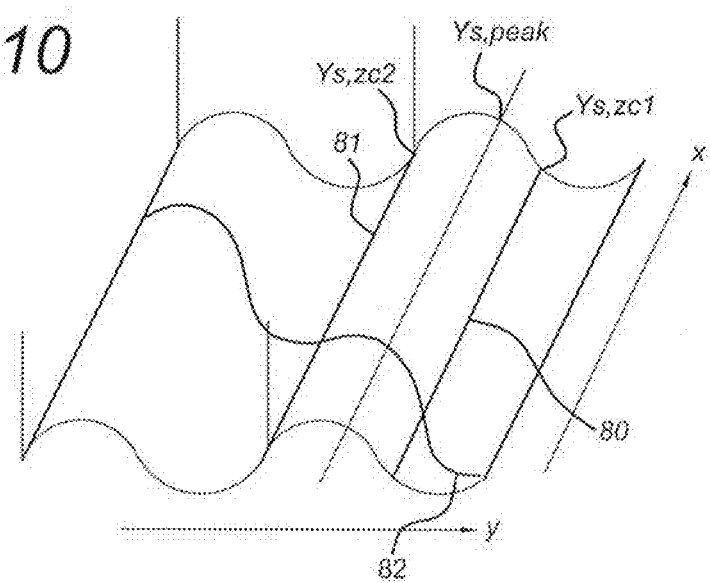
FIG. 10 illustrates schematically a flank scan according to an embodiment of the detection method.

If the extended mark were to be slightly rotated under scanning a sinusoidal signal arises. It is intended that the first scan of the flank scan is performed at the position $Y_{s,ZC1}$ in the second direction (corresponding to line 80 in FIG. 10). As this is at the flank of the intensity profile, this is also referred to as a flank scan. The opposite scan should be performed at $Y_{s,ZC2}$ (corresponding to line 81 in FIG. 10) which obviously then also is referred to as a flank scan. If the extended mark happens to be rotated as a result of misalignment in any of the pre-measurement steps, a sinusoidal signal arises as a result of the diffractive properties in the second direction Y (corresponding to line 82).

Alignment is sensitive to position noise directly on the slope of the signal. This is caused by the fact that the derivative with respect to the position is at a maximum on the slope of the signal. Any small deviation in position results in a maximum deviation of the intensity signal.

On the other hand at the peak of a signal alignment is insensitive to position noise since the derivative with respect to position is zero. Any variation in signal strength caused by the laser now becomes dominant. In an embodiment the detection method comprises detecting a property of the extended pattern along the first direction at the relative second position near the peak, indicated in FIG. 10 with $Y_{s,peak}$. In the obtained signal the laser noise is dominant and said signal can be used for possible noise reduction in the signals at other second positions.

As explained, by measuring on the slope of the spatial intensity profile and moving along the grating of the at least 35 mm, at least 45 mm, at least 90 mm, at least 190 mm, at least 290 mm or at least 440 mm long extended pattern, the intensity variations as function of the substrate table WT position can be measured at maximum sensitivity. The intensities as measured during a flank scan, wherein the extended pattern is scanned at relative position $Y_{s,ZC1}$, comprise a noise component. Embodiments of the invention comprise steps to reduce noise in the scanning of the extended pattern along the first direction.

The measurement may be repeated starting from the other near peak response zero crossing: thereby, two measurements along the same parallel lines are obtained, which allows to account any differences observed to variations in reflection of the surface of the substrate, thereby the two measurements allowing to take into account such fluctuations in reflectivity of the surface of the substrate. As indicated in FIG. 5a the slope of the diffraction signal has a different sign. If the extended pattern is deformed as a result of errors during forming the extended pattern on the substrate, such as schematically illustrated in FIG. 4, the grid errors near the $Y_{s,ZC1}$ and $Y_{s,ZC2}$ positions will result in signals with opposite changes. On an absolute scale the changes are similar, however of a different sign (positive, negative).

Figure 11:
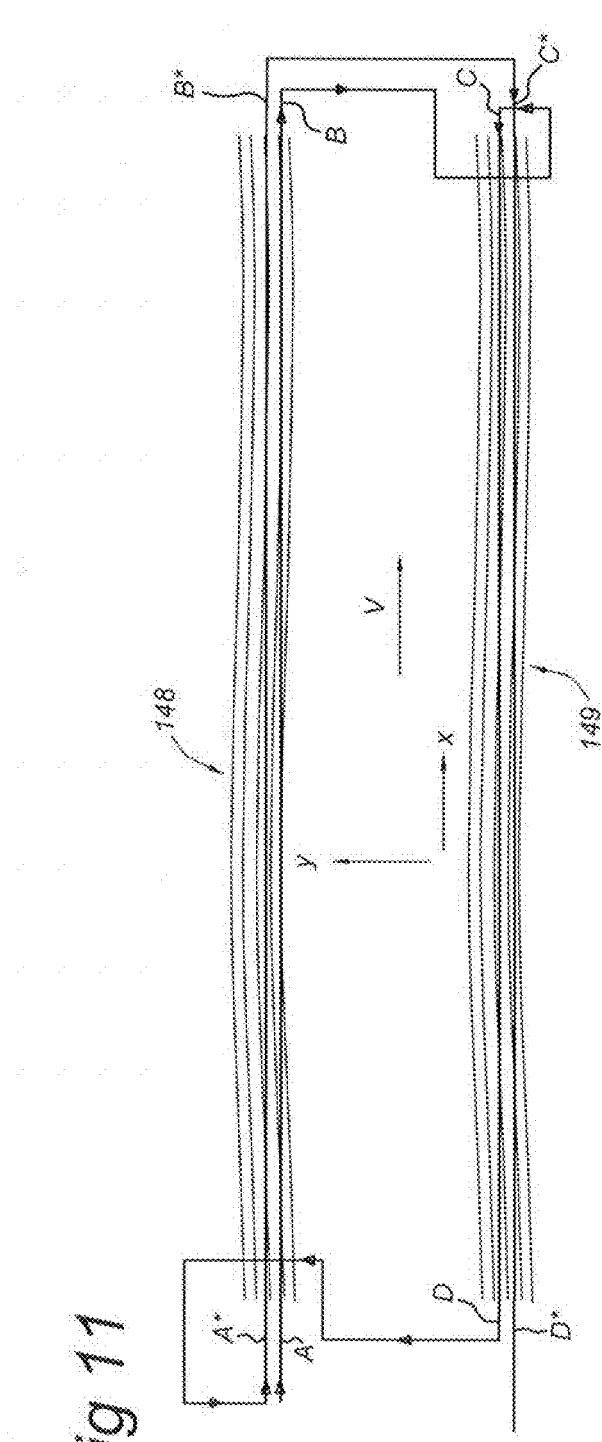
FIG. 11 illustrates an embodiment of a flank scan.

In a further embodiment of flank scanning, two generally parallel extended patterns 148, 149 are used (FIG. 11). After a first prescan, position A is found as a position of a zero crossing of a first extended pattern 148 of the two generally parallel extended patterns. From position A (a coordinate in the y direction in the indicated x-y coordinate system), a scan in the x direction, along the first direction of the first extended pattern 148 is performed. The lithographic apparatus is controlled such that from A the substrate table WT is moved with respect to the alignment sensor in a direction parallel to the extended pattern. Although the detected property is first a signal close to zero (as it is a zero crossing), due to deviations in the extended pattern in the second direction, the signal will change when the substrate table and substrate are moved in the first direction.

By moving from A in a direction x, eventually the complete extended pattern is scanned and a position B is reached. Position B (again characterized by its coordinate in the y-direction) does not need to be a zero crossing, since the extended pattern could have a deviation at that very position. In an embodiment the measurement spot is moved in the second direction by a distance equal to the grid size. The embodiment according to FIG. 11 is different however.

From B the substrate table WT is moved such that it is possible to scan a second extended pattern 149 in the second direction, performing a prescan, in order to find a zero crossing, indicated with C in FIG. 11. The alignment sensor is than set to scan the extended pattern 149 from C in an x direction along the extended pattern 149 towards D.

From D the substrate table is again moved, and in an embodiment another prescan is performed in order to find a different zero crossing from A, here A*. Subsequently a scan is performed from A* to B*, in a direction completely equal to the direction of the first scan of extended pattern 148. Then a second scan at a different zero crossing C* is performed on extended pattern 149 in a direction towards D*.

The method according to FIG. 11 will result in two flank scan data sets that will allow to separate reflectivity and diffractive intensity.

Scanning a mark back and forth can reduce noise induced by the movement of the substrate table, laser noise, noise related to control and temperature.

In an embodiment the detection method of detecting a property of the extended pattern comprises detecting a diffractive property and multiple orders of the diffractive signal may be measured. The metrology device for detecting a property of the extended pattern comprises a tool, such as an alignment sensor, that is arranged and constructed to measure and separate multiple orders, such as the fifth and seventh order signal in a diffractive response signal. In a single scan multiple signals resulting from the diffractive property of the extended pattern formed by grid lines, can be obtained.

In an embodiment a next scan of the extended pattern along the first direction comprises repositioning from $Y_{s,ZC1}$ to $Y_{s,ZC2}$, (e.g., 8 um in case of 8 um alignment structure) and doing the reverse movement while measuring the intensity profile yields two signals of the extended pattern (being for instance 200 mm or longer). This repositioning leads to a scan at a position at the other near peak zero crossing of the diffraction signal obtained during a scan in the second direction.

The back and forth scan of the extended pattern along a first direction yields two signals $S_1$ and $S_2$. The half of the sum of signals $S_1$ and $S_2$ can be expressed as the substrate reflectivity. Subtracting the substrate reflectivity from the original signal $S_1$ and $S_2$ makes it possible to correct for this effect. Alternatively, the difference of signal $S_1$ and $S_2$ can be expressed as the twice the original trend in the signal and correcting for this trend yields a noise term.

In an embodiment to reduce noise even further sample points within one scan can be averaged to a pitch of 1 mm. A full scan can contain 16000 sample points spanning 300 mm, i.e., 53 samples points per millimeter and in some application spanning 450 mm. This can be used to reduce the noise with a factor 7.

Normalization is also a known technique for noise (laser noise) reduction. In an embodiment frequency transformation, Fourier transformation, can be applied for normalization and noise reduction.

Measuring a Modulated Extended Pattern

In an embodiment the extended pattern was formed using a modulation technique or was formed using a patterning device arranged to be used in illuminating an extended pattern having a modulation in the second direction, e.g., as discussed in combination with FIG. 9d. Applying a known and predetermined signal to the substrate table position drivers can also reduce noise in the measured signal for scanning the extended pattern along the first direction. Since the signal is known it can be removed from the signal. An advantage of modulating the signal to be measured by the alignment sensor is that the Signal to Noise Ratio increases as most of the time a non-zero value can be measured. In the alternative of measuring at the peak ($Y_{s,peak}$ in FIG. 10) the measurements are less sensitive.

In an embodiment the extended pattern, having a generally extended form in the first direction, is formed on the substrate having a modulation in the second direction. In an embodiment extended pattern alignment marks are formed on the substrate at positions that form an extended centerline of an equilibrium position, which serves as a reference position, of the modulated extended pattern. This allows reading the equilibrium position in a pre-alignment step. In another embodiment multiple scans in the second direction are performed in order to obtain data with respect to the equilibrium position (as a reference position). Multiple scans are used since it is not known beforehand which phase of the modulation corresponds to which position in the first direction. Therefore scanning in the second direction at different positions in the first direction may be used to determine and couple the phase of the modulation to the position in the first direction.

In an embodiment the extended pattern comprises at least a section that is without modulation, e.g., the first 10 mm close to the end section of the extended pattern in order to allow to obtain the equilibrium position and to obtain flank scanning positions from the double zero near peak positions that can be obtained from the diffractive data when scanning the extended pattern in the second direction.

In an embodiment an extended pattern in the first direction comprises multiple sections having a pre-defined modulation amplitude. In an embodiment different kinds of modulations extend over different lengths in the first direction. Having different kinds of modulations or different modulation frequencies or amplitudes allows optimization for different purposes.

Measuring Along the First Direction of the Extended Pattern Using Modulation

In an embodiment of the detection method and lithographic apparatus for measuring a property of an extended pattern, modulation is used for measuring the property. The extended pattern can be formed without modulation.

Examples of using modulation in a detection method comprise a servo controlled modulation in a y direction during detection of a property along the extended pattern in the first direction or/and using the natural frequency of the substrate table.

In an embodiment the substrate table is vibrating at its natural frequency. Several methods are available for generating the energy to bring the substrate table into a vibrating state. A substrate table WT and a substrate W vibrating at their natural frequency will have a known frequency and a relatively stable amplitude. In an embodiment the substrate table and the substrate have a vibration that comprises a vibrating action in the second direction, perpendicular to the first direction of the extended pattern. In an embodiment, the vibration in the second direction comprises a majority of the vibration of the substrate table and substrate. During moving of the substrate table and detecting a property of the extended pattern, the substrate and the substrate table will move with the natural frequency with respect to the alignment sensor and the position sensor IF (FIG. 1). In a subsequent step this vibration can be separated from the signal and will lead to a noise reduction. The movement of the substrate table WT can be detected with the position sensor (IF). The measured/determined position can be coupled to a detected property.

Figure 8A:
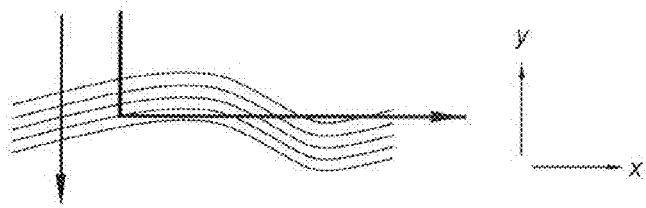
FIGS. 8a-d illustrate schematically relative movements of a schematic embodiment of a substrate having an extended pattern with respect to the lithographic apparatus.
Figure 8B:
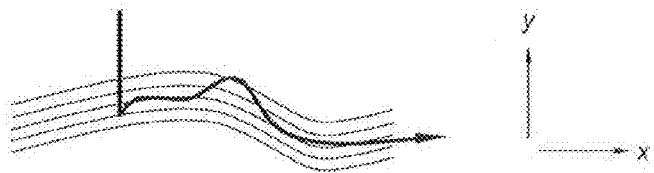
Figure 8C:
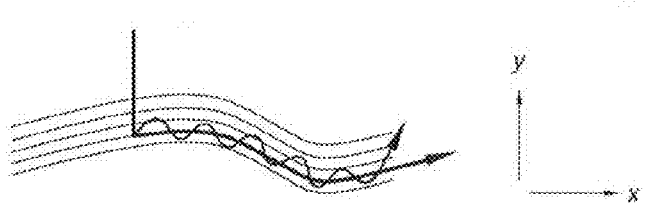
Figure 8D:
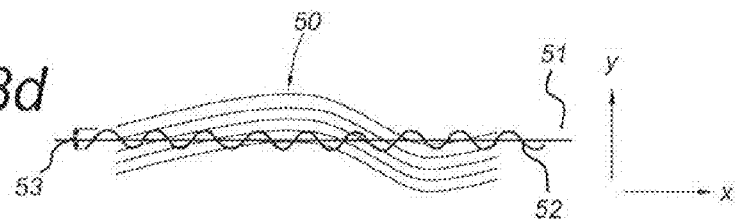

FIG. 8(d) illustrates an extended pattern 50 comprising five grid lines. It was formed at an expose side and on an enlarged scale deviations in the second direction (y) as a result of encoding errors in positioning are shown. At a measurement side, a metrology device such as an alignment sensor is directed at the extended pattern 50, the substrate table WT is moved with respect to the metrology device and, if no positional errors occur the substrate table and the substrate are moved with respect to the tool according to line 51. If the substrate table and the substrate vibrate at the natural frequency, a vibrating movement 52 is superimposed on the line 51. The signal received will as a result of the natural frequency having an amplitude 53 move back and forward over the grid lines resulting in a detected signal that is similar (mutatis mutandis) to a signal moving over FIG. 5a between the ends of arrow 53. As a result of deviations in the extended pattern, this signal will differ slightly and these errors can be corrected for in a subsequent calibration. The natural frequency can be separated from the detected signal.

Using the method according to the invention an accuracy of 8 nm can be obtained. When corrected with the at least a combination of two or more of the noise reduction methods, including a modulation technique, a sub-nanometer accuracy is obtainable.

Stitched Mark Measurements

In an embodiment a first set of gridlines is produced in a first layer and a second set of gridlines is produced in a second layer. Both sets of gridlines are periodic with the same period in the second direction. The first set and the second set of gridlines are interlaced. The combination of this stitched extended pattern is also referred to as a stitched mark. In case the stitching error is zero (or in case of perfect overlay) the second set of gridlines is positioned between the first set of gridlines so that the stitched mark is periodic with half the period of the first and second sets. In this case the gridlines of the second set of gridlines have an equal distance to the neighbouring gridlines of the first set of gridlines that surround it. In case of a stitching error (or an overlay error), for instance because of deviations during the production of the first set and second set of gridlines, the second set of gridlines is displaced in the second direction. As a consequence the distance between the gridlines of the second set of gridlines and a first neighbouring gridline of the first set of gridlines is smaller than the distance between the gridline of the second set of gridlines and a second neighbouring gridline of the first set of gridlines. The stitched mark is now periodic with the period of the first or second set of gridlines and not with half that period.

In the embodiment an alignment sensor is used that is arranged to irradiate the stitched mark with a beam of alignment radiation and that is capable of measuring intensities of diffraction orders of the beam of alignment radiation diffracted by the stitched mark. In the case of the zero stitching error (perfect overlay), only integer diffraction orders are created (i.e., first, second, third, fifth, seventh, etc.) As diffraction orders are diffracted with different angles with respect to the beam of alignment radiation, the orders can be identified by their angle (or their distance to the beam of alignment radiation and thus their position on a receiving part of the alignment sensor as will be clear to the skilled person). Because in case of a stitching error (overlay error) the distance between the gridlines of the second set of gridlines and the two neighbouring gridlines of the first set of gridlines differs, the diffracted radiation comprises fractional diffraction orders i.e., {0.5, 1.5, 2.5, 3.5 . . . } next to integer diffraction orders. They are fractional relative to the first integer diffraction order. The higher the offset (stitching error or overlay error) from having equal distances between the lines of the stitched mark, the larger the intensity of the fractional diffraction orders relative to the intensity of the integer diffraction orders.

In case the first set of gridlines and the second set of gridlines are not periodic in exactly the same direction, the intensity ratio between the fractional and the integer diffraction orders change in the first direction.

By using an alignment sensor capable of measuring the intensity corresponding to at least one fractional diffraction order and the intensity of at least one integer diffraction order, the spacing between the lines of the stitched mark (i.e., the overlay between the first set of gridlines and the second set of gridlines) can be determined. This is done by comparing the intensity of at least one fractional diffraction order and the intensity of an integer diffraction order.

Depending on stitching error or overlay error, a scan of the extended pattern as schematically illustrated in FIG. 12 (or a prescan of the extended pattern G22 according to FIG. 9b), results in detecting diffractive pattern comprising such fractional diffraction orders.

In an embodiment an alignment step is performed in that a further reference position is deducted with a coordinate in the second direction of the stitched extended pattern that is similar to the second coordinate for a flank scan of a normal (non-stitched) extended pattern. Again positioning in the second direction with respect to the stitched extended pattern in chosen such that the sensitivity of the actual measurements of the intensity of the diffractive pattern is maximal when scanning in the first direction. As explained the sensitivity can be maximized close to a zero-crossing, for instance on a flank of a protruding gridline.

An advantage of this embodiment is that metrology becomes more accurate since two extended patterns are measured in one scan (detection step) by moving in the first direction. The stitched extended patterns allow for example performing a substrate alignment step for both layers while at the same time measuring their relative behavior.

Measuring two layers at the same time increases the communality in readouts of the two layers. In a single readout temperature and vibrations are equal. In a repeated scan, temperature changes and vibrations will lead to different noise contributions during both readouts. In a single scan, the noise contribution is shared.

An extended pattern having a $5^{th}$ order layer (a x/5 wide grid line) and a $7^{th}$ order layer (x/7 wide grid line), then during a wafer alignment method two global wafer coordinate systems can be calculated for both layers. However the relative difference between the two layers can be measured by the fractional orders, since information in the fractional orders is a measure for the relative behavior of both layers with respect to each other.

Since the two extended patterns are on the same global wafer coordinates they share the same grid features or mirror features. Simultaneous read out, leads to a sharing the same grid or mirror location preventing an additional error.

In order to perform a measurement scan on the two layers at the same time a 'flank' can to be chosen for the $7^{th}$ and $5^{th}$ order. These two layers have to share the same global wafer coordinate system. During an initial calibration scan in the second direction such a position can be determined as indicated above.

Controlling Moving the Substrate Table

In an embodiment a servo control for controlling movement of the substrate table, and in particular in the measurement stage of the lithographic apparatus, has at least two modes for scanning the extended pattern in the first direction. In an embodiment one of the modes is used for scanning the extended pattern in the first direction. In an embodiment a combination of modes is used. The modes for operating the movement of the substrate table are known from calibration techniques used extensively in lithography.

In an embodiment the movement of the substrate table is controlled while controlling the position of the substrate table with respect to a reference such as a grid plate. In this manner the substrate table will follow the errors in the reference. This mode is known as high bandwidth control. FIG. 8b shows schematically an alignment scan when the substrate table (WT FIG. 1) is under high bandwidth control. If the extended pattern is scanned under high bandwidth control, the signal to be measured is the variation in light intensity. During high bandwidth control a signal representing the light intensity is obtained in dependence on the measure grid and expose grid. As a result of, not yet known, errors in positioning of the substrate table, the substrate table WT and the substrate W having the extended mark can move with respect to the metrology device such as the alignment tool deviating from a straight line in the first (x) direction.

In an embodiment a servo control for controlling movement of the substrate table is independent from its measured location. Such control settings can be referred to as under low bandwidth control. Servo control is performed without feedback of the measured position. Under low bandwidth control a light intensity signal is obtained by scanning the extended pattern in the first direction which signal is dependent on the expose grid only. FIG. 4 shows schematically an alignment scan when the substrate table is under low bandwidth control. If the extended pattern is scanned under low bandwidth control, the signal to be measured is the variation in light intensity. Since the position of the substrate table and therefore the substrate and the extended pattern is not controlled with a positioning system, the movement of the substrate/extended pattern is controlled using the stroke modules only. During low bandwidth control a signal representing the light intensity is obtained in dependence on the expose grid.

In an embodiment the servo control for the substrate table is arranged to follow the slope of the signal detected along the extended pattern, in particular if the extended pattern is formed having a modulation. In an embodiment the servo control for moving the substrate table is controlled using a feedback signal from the alignment sensor. While scanning the signal measured with the alignment sensor is held constant. In an embodiment a derivative of the signal received in the alignment sensor that represent light intensity sensed in the sensor, is calculated. As change in the derivative signal is immediately resolved e.g., by a correctional movement of the substrate table, for example using the servo control in the second direction.

In this embodiment both the expose and measure grid are used for determining a calibration measurement using the extended pattern. An example of 'following the flank' is shown in FIG. 8c, wherein, although the extended pattern is formed having deviations in the second direction, the relative position on top of the grid is maintained or centered close to the second and third grid line. By maintaining a relative position with respect to the property to be measured of a physical property in the second direction, following the flank becomes possible. From the data measured, and in particular from the positional data that was detected, errors in the extended pattern that were the result of errors at the expose stage, are directly obtainable.

If the servo control for the substrate table is arranged to follow the extended pattern, the position of the substrate table using the measure grid can be followed and can be compared with the position of the extended pattern formed on the substrate. If the extended pattern is formed having a modulation, this modulation will be present in both data sets and can therefore be cancelled out. Comparing the two data sets will result in a deviation of the encoder position and the extended pattern formed on the wafer.

In a further embodiment property sampling of the extended pattern is possible with an image sensor similar to any of the above mentioned method steps. An image is sampled on top of extended pattern and several images can be sampled along the first direction. Any deviation for the image is corrected in 6 DOF and added to an IFM/encoder system, such the image remains with the view of the camera. This method allows correcting e.g., the IFM/encoder system with respect to an alignment system.

The moving of the substrate when projecting the pattern onto it may for example be performed at half a scanning maximum speed of the lithographic apparatus, and with a high servo control bandwidth, so as to allow the stage to follow the measured encoder grid errors as measured by the encoder system with a high accuracy.

Calibration

In an embodiment creating the extended pattern on the substrate will be performed at the expose side of a dual stage lithographic apparatus, while the measuring will be performed at the measurement side. In an embodiment the lithographic apparatus according to FIG. 1 comprises a measure grid and an expose grid. A position of the substrate table WT at the measurement side is measured using the measure grid. In this embodiment the second positioning device PW comprises the measure grid.

Therefore, encoder grid errors at the measurement side may also translate into observed deviations when performing the measurement along the line. In order to enable to distinguish between these sources of error (encoder grid at the expose side and at the measurement side), the substrate may further be rotated by substantially 90 degrees in the plane of drawing of FIGS. 3 and 4, and the measurement being repeated along the extended lines in the other direction. Thereby, errors in the extended lines on the substrate may be discriminated from errors of the encoder position sensor at the measure side, thus enabling to take each into account appropriately. In order to further discriminate between these sources of error, the substrate may further be translated, and the measurement repeated.

The translating may in a practical embodiment be achieved by projecting a second pattern onto the substrate which pattern is translated relative to the other pattern, and using the translated pattern for the latter measurement, thereby obviating the need to displace the substrate on its stage (thus obviating an additional source of errors).

In an embodiment two patterns are exposed on top of each other with a slight translation such that during both patterns can be readout in a single scan without translating the stage. The detected properties can be used to construct a calibration map for overlay. In an embodiment the second exposed extended pattern is positioned next to a reference extended pattern formed on a substrate placed in the lithographic apparatus as a part of a maintenance procedure.

As a continuous or semi continuous measurement along the extended pattern (in this example the parallel lines) is performed, data in a wide spatial frequency range may be obtained, which may obviate the need to make use of a plurality of different calibration techniques, thereby possibly achieving a fast calibration and possibly obviating the need to stitch the different calibration results of the different calibrations together, thereby possibly saving processing time and avoiding ambiguities between the calibration results of the different calibrations. It is remarked that a discontinuous measurement is also possible in an embodiment of the invention.

Height Measurements and Z-Grid Calibration

Height measurements (Z-coordinate) of a substrate or substrate table with respect to the lithographic apparatus and more specifically a two dimensional z-grid calibration are desired for a lithographic apparatus, and specifically, but not limited to, for a lithographic apparatus comprising a positioning system having an encoder system including grid plates. Z-grid calibration can comprise error corrections for z (height), Rx and Ry of the substrate table WT with respect to the grid plates or of the substrate table WT comprising the grid plates with respect to the encoder system. A high resolution for calibration is desirable. A combination of techniques can be used to perform the calibration, such as a level sensor and a single shot focal method. However the combination of techniques is time consuming and can take up to 5-6 hours for full calibration.

One of the problems of current calibration techniques and in particular Z-grid calibration, is that the exposure time and total read-out time for performing all calibration measurements and calculations are generally proportional to the desired resolution. With increasing resolution demands, calibration time will increase further.

Figure 16A:
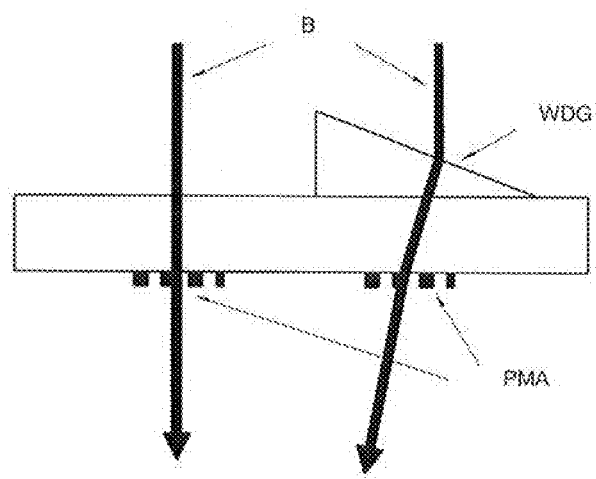
FIGS. 16a and 16b illustrate schematically a Prefoc/LVT method.
Figure 16A:
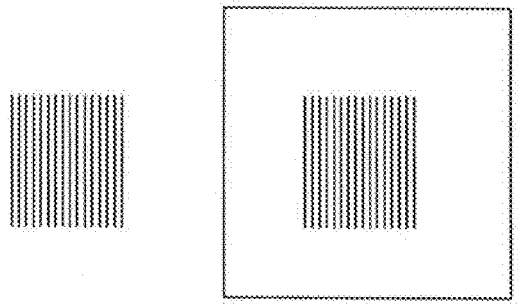
Figure 16B:
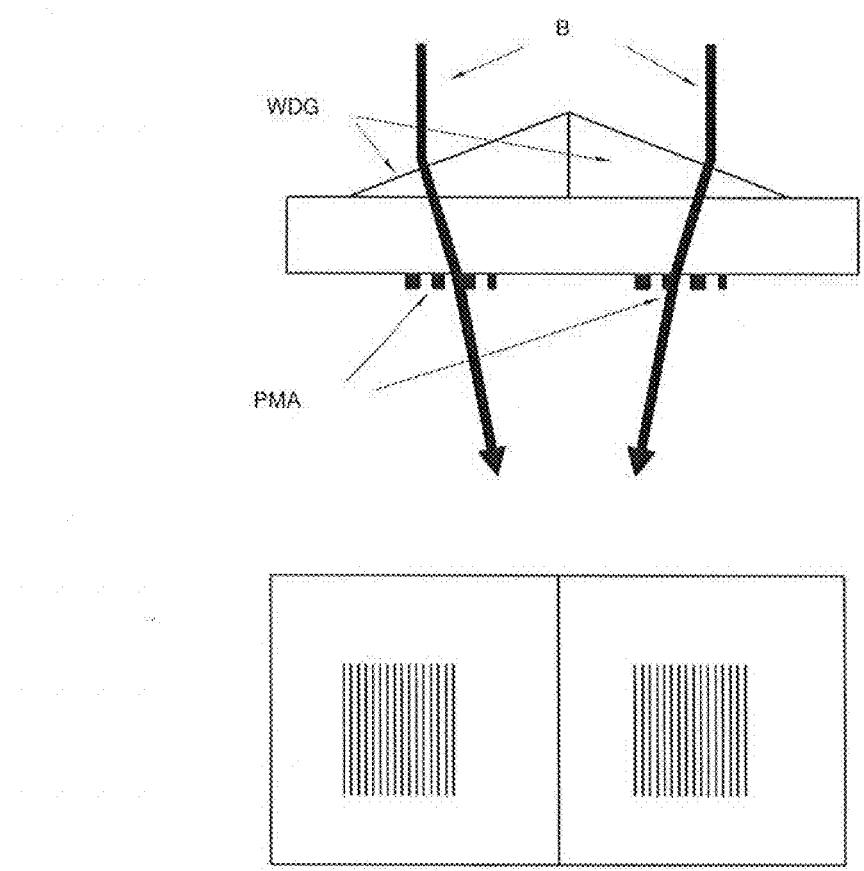

A method is provided for performing z-grid calibration more quickly than prior art solutions. The method comprises forming a focus sensitive extended pattern on a substrate supported by a substrate table by moving the substrate table with respect to a patterning device during exposure, resulting in a focus sensitive extended pattern. A pattern is exposed on the substrate while moving the substrate table in a first direction, thereby forming the extended pattern as described before. The method comprises the step of forming the extended pattern using a known technique for forming a focus sensitive mark. Examples of focus sensitive marks are marks comprising a wide line in combination with fine lines and/or marks formed according to the single shot focal method, FOCAL marks (partially chopped lines) and/or PreFoc/LVT marks. The focus sensitivity of Prefoc/LVT marks is created by using non-telecentric/tilted illumination. This is shown schematically in FIGS. 16a and 16b. Beams of radiation B from a radiation source are guided through a schematically illustrated wedge WDG, resulting in a shift of the resultant position of the formed mark. Using a patterning device of suitable points PMA, the extended pattern is formed by moving the substrate in the direction of the formed lines of the marks. The left hand side shows a single Prefoc/LVT mark, the right hand side a double Prefoc/LVT mark.

In an embodiment the method comprises forming a focus sensitive extended pattern extending in a first direction. The focus sensitive extended pattern is formed in dependency of the local height of the substrate and/or substrate table with respect to the lithographic apparatus and therefore height errors can be part of the formed extended pattern. A focus sensitive extended pattern allows measurement of the height errors. Examples of height errors are:
- encoder/grid errors
- errors in substrate height measurement
- stage positioning errors
- deformation of WT/chuck due to thermal and/or mechanical forces
- image height errors
- residual mask errors In an embodiment height errors result in shifting (positional displacement) of the extended pattern in the second direction during formation of the extended pattern. Examples of such a focus sensitive extended pattern are shown in FIGS. 14a and 14b which have been described above. The focus sensitive parameter can be measured by measuring a property of the extended pattern in the second direction, along the pattern in the first direction. The focus sensitive parameter can also measured using a focus sensitive structure such as the example of FIG. 13a.

In FIGS. 14a and 14b each line represents an extended pattern formed from a focal mark unit, wherein each focal mark unit comprises a wide main line and one or more adjacent fine lines as illustrated in FIG. 13a.

Measuring a parameter related to height or Z-coordinates, is possible according to different methods. A possible method includes direct measurement of the positional shift using a direct measuring tool such as a direct scanning technique for measuring a second-direction parameter of the formed extended pattern. The direct measurement tool can comprise a scanning electron microscope or a scatterometer.

In a direct measurement tool a formed part of a line of an extended pattern and especially of a special purpose extended pattern such as the focus sensitive extended pattern can be analyzed. With a direct measurement tool the formed width and or steepness of the formed line can be measured/analyzed and can be used to calculate a property such as height and can be used to perform a z-grid calibration.

In the example of FIG. 13a, the fine lines 121, especially fine lines comprising a set of adjacent lines having a consecutively reducing line width in the y110 or second direction, will directly show focus sensitivity. A lack of focus will result in the most finest lines (smallest line width) not being formed, while wider lines are formed. The line width of formed fine lines extending in the first direction is an example of a parameter extending in the second direction that can be measured in a subsequent method step.

In an embodiment the second-direction parameter is measured by scanning along the extended pattern in the first direction. This allows obtaining a value for the second-direction parameter, here representing a focus sensitive parameter, over at least a part of the length of the extended pattern, in an embodiment over a distance in the first direction that is at least 40×, in a further embodiment at least 80× the width of the mark in the second direction. Scanning allows obtaining values representing the desired parameter over a large distance in a relatively small amount of time, allowing more quick measurements and eventually quicker calibration.

In an embodiment a position in the second direction is found and used similar to the embodiments according to FIG. 3 and FIG. 4, so called flank-scan.

In an embodiment scanning along the first direction is performed using high or low bandwidth mode according to FIGS. 8a and 8b. In an embodiment scanning the extended pattern comprises following a line of the formed extended pattern, that is measuring e.g., the displacement in the second direction, such as the line width of a line. In another embodiment scanning comprises only a movement in the first direction and measuring a parameter of the extended pattern at a certain coordinate in the second direction.

In an embodiment scanning along the first direction comprises performing a modulated scan according to FIG. 8c or 8d. In an embodiment the focus sensitive extended pattern is formed using modulation according to any of the described embodiments.

In an embodiment first a height calibration according to any of the methods described herein is performed using an extended pattern. Only after a height calibration a further calibration such as XY calibration is performed by forming an extended pattern for that purpose and measuring a desired parameter. The design of the focus sensitive patterns (i.e., combination of regular pattern in combination with a focus sensitive pattern or the use of two focus sensitive patterns with opposite sensitivity) make the focus measurement (more or less) independent of XY errors. This will allow isolating height errors more easily from other positional errors. Alternatively one would measure a property that is only focus sensitive (e.g., side wall angle) using a scatterometry system.

In another embodiment the method comprises measuring a second-direction parameter resulting from diffractive properties of the special purpose extended pattern. The special purpose extended pattern according to FIG. 13a has diffractive properties in the second direction similar to a 'normal' extended pattern as illustrated in FIG. 3 and FIG. 4. Similar measuring methods are possible The formed extend pattern comprising main line 120 and fine lines 121 will have diffractive properties in the second direction that can be scanned using a method according to the invention by scanning along a first direction. If due to severe non-focus all fine lines 121 are out of focus and as a result thereof are not formed, or at least not completely, than the diffractive property of the main lines 120 extending in the first direction is very similar to the diffractive property of the normal extended pattern. In FIG. 13b a result of measurement of the diffractive property of the formed extended pattern is measured in the second direction y110 is shown. Peaks (maximum intensities) 127 of the resulting spectrum as shown in FIG. 13b lie at the center line 128, shown as a dotted line, of each of the main lines 120.

If however some of the fine lines 121, and especially some of the wider lines of the set of fine lines 121 are formed as a result of some focus, the resulting peaks in the diffractive spectrum will shift as is indicated in FIG. 13c toward a position indicated with dotted lines 129. The shift from centre line 128 to the measured position 129 is directly dependent on local focus.

LVT/Prefoc marks lead directly to shifted patterns. By comparing the shift of a regular pattern with the shift of a LVT/Prefoc pattern or by comparing LVT marks with different wedges, the focus (Z) contribution can be separated from the XY contribution.

Scanning along the special purpose extended pattern in any of the modes according to FIG. 8, will allow to detect the shift of the peak 127 as a result of local focus errors.

In an embodiment the special purpose extended pattern 119 is formed extending in the first direction, wherein in that first direction one or more parts of the pattern are formed with—and one or more parts are without the fine lines 121. In the first direction the pattern 119 will have a part showing focus sensitivity and a part showing no focus sensitivity. This will allow to determine the centre position 128 of the main lines 120 during the scan in the first direction as a first step and measuring focus as a result of the partially formed fine lines 121 for the remainder of the extended pattern.

Within the invention other embodiments for measuring the special purpose extended patterns are possible.

Lithographic Apparatus Calibration Process

In a lithographic apparatus, an alignment of the patterning device (mask) with respect to the substrate (wafer) may be required, e.g., in order to ensure that a following irradiation of the wafer with a patterned radiation beam matches a pattern already established on the wafer.

Thereto, in an embodiment, use is made of a sequence of calibrations to achieve a desired positioning accuracy. A description of such a sequence is provided below.

A patterning device (such as a mask) is loaded onto a support (such as a mask table), a wafer (or other type of substrate) is loaded onto a wafer stage (or other type of substrate stage). Measurement of a position of the mask, a position of the wafer and possibly a flatness of the wafer are performed, after which the wafer is exposed.

The loading of the mask onto the mask table provides a positioning of the mask with respect to the mask table on a micrometer level. Then, by a suitable measurement system of the lithographic apparatus, a position of the mask with respect to the mask table is measured on micrometer level. Also, a position of the mask table with respect to the projection system is measured by a suitable position measurement system of the lithographic apparatus. Hence, the position of the mask is known with respect to the projection system on a micrometer level.

The loading of the wafer on the wafer stage, also referred to as wafer stage, also provides for a positioning of the wafer on the micrometer level. The position of the wafer stage is measured with respect to the metrology frame by an interferometer and/or encoder measurement system.

A more accurate position measurement on nanometer level or sub-nanometer level is performed as a next step. A position of a reference of the wafer stage is measured in the dimensions x, y and Rz with the encoder or interferometer in combination with an alignment sensor in cooperation with a reference of the wafer stage. Using the same measurement system in combination with a calibrated grid on the wafer, x, y and Rz positions of the wafer are determined. Thereby, the position in the horizontal plane and a rotation with respect to the vertical axis has been measured for the wafer and the wafer stage. Then, making use of the flatness measurement system and the reference of the wafer stage, the positions z, Rx and Ry of the wafer stage are determined thereby providing wafer stage height and tilt. The same measurement system, applied onto the grid on the wafer, provides wafer height and tilt z, Rx, Ry. In a dual stage system having a measurement side and an expose side, the above measurements are performed at the measure side. As the position of the wafer as well as the position of the wafer stage references are known, the position of the wafer can now be determined with respect to the references of the wafer stage. The wafer stage including the wafer is now moved to the expose side. At the expose side, the position of the wafer may now accurately be determined by measuring the position of the references of the wafer stage. Thereto, a measurement is performed in which mask references of the mask are projected via the projection system onto a respective reference of wafer stage. Hence, the position of the mask is now accurately determined with respect to the position of the references of the wafer stage. By performing this measurement on multiple references of the wafer stage (e.g., located a respective edges thereof), the position of the mask table is determined in 6 degrees of freedom, allowing to calculate the position of the wafer there from, as the position relation between the wafer and the references of the wafer stage has been determined at the measure side. Thus, the position of the wafer in 6 degrees of freedom is calculated from the position of the mask image in 6 degrees of freedom, on the basis of a delta between the position of the wafer and the reference position of the wafer stage at the measure side. Exposure of the wafer may now take place.

The above process may be repeated for a following process layer on the wafer on the same lithographic apparatus and the same wafer stage, the same lithographic apparatus and another wafer stage or on another lithographic apparatus.

Accuracy Considerations in the Lithographic Apparatus Stage Position Measurement Positions on the wafer are determined during the measure and expose cycle making use of a stage position measurement system, such as an encoder, interferometer or an interferometer/encoder combination. In general, a measurement system incorporates its own length standard of which a stability is guaranteed over a time period. Such a standard may be based n a physical entity such as a scale in one or two dimensions or a physical property, such as a wavelength of a stabilized optical beam, or others. As a target measurement area of the wafer is two dimensional, a two dimensional scale may be desirable. In case use is made of an interferometer wherein a wavelength provides a standard for the measurements, a single dimensional interferometer may be expanded to two dimensions by a one dimensional reflector or mirror. In current lithographic apparatuses, a targeted position accuracy for the exposure of the wafer is in the order of magnitude of 0.1 nanometer, while an accuracy of a standard such as a scale or grid of an encoder or a mirror flatness of an interferometer mirror may be orders of magnitude larger, e.g., in an order of magnitude of 100 nm or larger. These scale errors or mirror maps in case of interferometers may be calibrated using the calibration methods outlined in this document. As a deviation of a standard may translate into a deviation of the position measurement, (re)calibrations, tracking, etc., may be helpful in increasing long term stability. For such tracking and recalibration, the calibration methods outlined in this document may be used, either in full or as a faster update e.g., using a limited amount of tracks, i.e., extended patterns.

Exposure positions and alignment marks may be at any position of the wafer surface area. Hence, accurate positioning over this area may be required. At the expose position, the horizontal X, Y, Rz as a function of X and Y, as well as the vertical grid Z may be calibrated using the calibration methods described in this document.

Furthermore, sensitivity to rotations such as tilting of the wafer stage may be found: Tilting of the wafer stage may be performed in order to compensate for an unflatness of the surface of the wafer. Such a tilting results in a change in an output signal of position sensors of the stage position measurement. A metrology model and a calibration map may be applied in order to compensate for such changes in sensor output. Thereby, using a metrology model in a form of a matrix, wafer stage position signals of the position sensors in a tilted position of the wafer stage may be calculated into position signals in an un-tilted position, which may then be calibrated, i.e., corrected for errors such as grid errors, by a two dimensional calibration map. This calibration map for Z, Rx, Ry and Rz, e.g., as a function of X and Y at the measure as well as the expose side may be calibrated using the calibration techniques described in this document.

In an embodiment, a matrix is provided of position correction terms at a plurality of fixed locations (e.g., fixed grid positions), which position correction terms may be added to the measured position in order to obtain the calibrated position. Interpolation of terms in the position correction matrix may be applied in order to provide for calibrations in between the fixed positions. In addition to the correction terms for correction of the position in x and y direction, each term in the calibration matrix may comprise one or more subterms in order to express corrections in multiple degrees of freedom. Thereby, a calibration correction in 6 degrees of freedom may be obtained. Also, use may be made of multiple correction maps, for example containing calibration results from different calibration methods for different spatial wavelength ranges. Furthermore, effects of switching between different position sensors or different reference grids may be taken into account in the calibration matrix.

Error Sources in Lithographic Apparatus Stage Position Measurement Processes

In the below, a plurality of error sources will be described for different configurations of lithographic apparatuses.

Single Stage Interferometer Position Measurement

A first configuration is provided by a lithographic apparatus having a single wafer stage and an interferometer based measurement system to measure a position of the wafer stage.

In this configuration, interferometer beams are reflected onto a mirror block of the stage. A translation of the stage in X or Y direction results in a relative displacement of the interferometer beam with respect to the mirror block. Unflatness of reflecting surfaces of the mirror block may result in stage position dependent inaccuracies.

The same holds for measurements of the stage position in vertical direction, performed making use of e.g., a tilted mirror of the mirror block. Vertical interferometer deviations at measure and at expose as well as measure to expose corrections may result from inaccuracies in the measurement in Z direction caused by unflatness of the mirror(s) used in the Z measurements.

Rotational deviations are calculated from the different interferometer measurements, e.g., performed by spatially apart interferometer beams. Inaccuracies in these interferometric measurements therefore translate into inaccuracies in the calculated rotations. The calibration techniques described in this document may be used for calibrations in 6 degrees of freedom.

A further source of error may be provided by grid deformations which take place during exposure due to immersion effects. For calibration of immersion specific effects resulting in position deviations the calibration methods described in this document may be used to determine a correction on the grid.

A still further source of error may be provided by wafer deformation due to wafer support, clamping induced forces on the wafer, grid distortions due to pollution and/or damage, etc. These deviations may be calibrated using the calibration method described in this document.

Dual Stage Interferometer Position Measurement

In a dual stage lithographic apparatus, having interferometric stage position measurement systems, essentially the same categories of errors may be found. As a result of mirror unflatness, errors may result in X, and or Y position measurements, Z position measurements, rotational positions as calculated from the measurements from spaced apart interferometer beams. Furthermore, errors may result from wafer stage deformations by forces exerted onto the wafer by wafer stage actuators, and forces exerted onto the wafer by a wafer clamping mechanism. Stage to stage differences in 6 degrees of freedom may be detected and corrected using the calibration method as described in this document.

Figure 17:
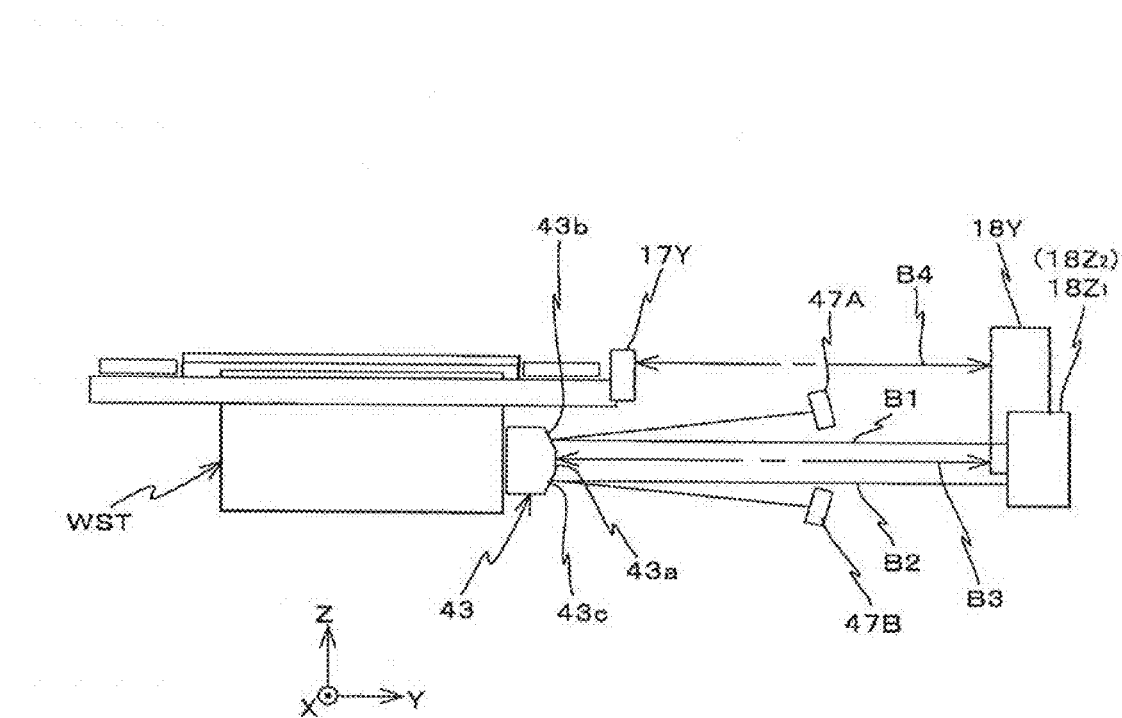
FIG. 17 illustrates an embodiment of a wafer stage interferometric position measurement arrangement.

A further example of position measurement errors caused by stage interferometer is described with reference to FIG. 17. A stage interferometer system comprises a first interferometer emitting beam B4 and a second interferometer involving beams B1, B2 and B3. Due to oblique surfaces 43b, 43c of mirror 43, beams under an angle are provided and incident on 47A, 47B. A vertical displacement of the stage, and hence vertical displacement of the mirror 43, will result in a change in the proportional lengths of B1 and B2 in respect of each other. Deviations in the Z grid as a result if mirror deviations and/or prism deviations may be corrected with the calibration method described in this document.

Further error sources in interferometer based systems may be provided in a configuration with two or more wafer stages within a single lithographic apparatus. In such configuration, errors may occur due to grid deviations between the grids associated with each of the stages, and grid deviations due to immersion effects. These sources of error may be corrected with the calibration method as disclosed in this document.

Still further error sources in interferometer based systems may occur from matching between different lithographic apparatuses, as a result of grid deviations between the grids of the different lithographic apparatuses. These sources of error may be corrected with the calibration method as disclosed in this document.

Encoder Based Stage Position Measurement

In encoder based stage position measurement, basically two configurations are applied at present. In a first configuration, a grid is connected to a stationary reference such as the metrology frame, while sensors are connected to the movable stage. A z measurement may be performed based on a reflection on the reflective encoder grid.

A second configuration (hereinafter referred to as "movable grid encoder configuration") wherein multiple sensors are connected to the stationary reference such as the metrology frame, while a grid being connected or forming part of the stage. A z measurement may be performed based on a reflection on the reflective encoder grid. In this movable grid encoder configuration, use may be made of a smaller grid, even at large ranges of movement of the stage.

A variety of possible sources of error will now be discussed for both these configurations.

Stationary Grid Encoder Configuration

In this configuration, within a single stage a variety of sources of error may be found including but not limited to: local grid deformation, global grid deformation due to production process tolerances, grid carrier tolerances, mounting and tolerances of individual grid plates, sensor inaccuracies, etc. These errors may have effect on stage positions as measured in x, y, z direction as well as rotations Rx, Ry, Rz.

Furthermore, different errors may occur at measure and at expose. Also, measure to expose errors may occur. Due to immersion effects, grid deviations may occur, which translate into measurement errors. Still further, stage to stage deviations and machine to machine deviations may result.

A still further source of error may be found in a configuration wherein the wafer stage is provided with 4 sensors at respective edges thereof, two of these sensors being arranged to measure in X and Z, while the other two are arranged for measuring in Y and Z. The stationary grid comprises a grid assembly comprising 4 grid plates which together form a grid plate assembly having a central opening for the projection lens assembly as well as for exposure. Due to this opening, in many positions of the wafer stage, it will be observed that 3 of the 4 sensors are in a position so as to cooperate with the grid plate assembly. The in total 6 position measurements obtained from the 3 sensors enable to determine the position of the stage is 6 degrees of freedom. Given the opening in the grid plate assembly, a fourth one of the sensors will be out of reach of the grid plate assembly. While moving the stage, depending on the position of the stage, a different one of the 4 sensors may be out of reach, which will invoke takeover errors. Such a takeover may result in deviations which may be calibrated using the calibration method as described in this document. Also, all other deviations may be corrected using the calibration technique described in this document.

Movable Grid Encoder Configuration

Also in this configuration, within a single stage a variety of sources of error may be found including but not limited to: local grid deformation, global grid deformation due to production process tolerances, grid carrier tolerances, mounting and tolerances of individual grid plates, sensor inaccuracies, etc. These errors may have effect on stage positions as measured in x, y, z direction as well as rotations Rx, Ry, Rz. Unflatness of the grid may furthermore translate into measurement errors in z, Rx and/or Ry.

Due to a relatively large range of movement as compared to the size of the grid, a plurality of sensors may provided, so as to have sufficient numbers of sensors available for cooperation with the grid in each position of the grid. Movement of the stage, thus of the grid, will thereby result in sensor switching, which may have effects on the measurement accuracy at measure and/or at expose. Also, measure to expose errors may occur due to e.g., grid deviation on the wafer. Due to immersion effects, grid deviations may occur, which translate into measurement errors. Still further, stage to stage deviations and machine to machine deviations may result.

Figure 18:
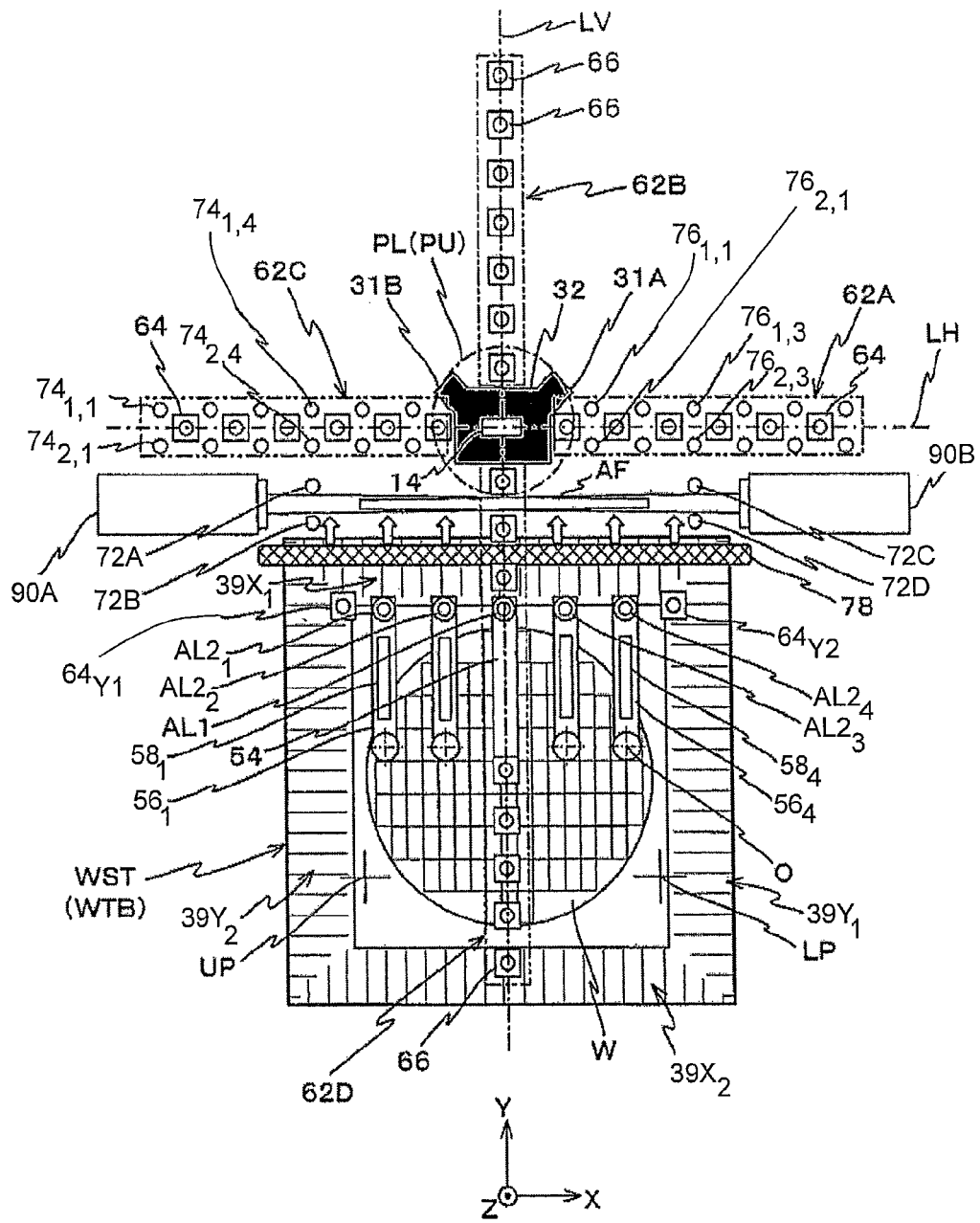
FIG. 18 illustrates an embodiment of a wafer stage encoder based position measurement arrangement, FIGS. 19A and B illustrate an embodiment of a calibration method, and FIGS. 20A and B illustrate an embodiment of another calibration method.

An example of a moving grid encoder stage position measurement system is depicted in FIG. 18. This configuration is further described in US 2008-0043212 (a1) which is incorporated herein in its entirety by reference. FIG. 18 depicts a top view of a wafer stage WST, encoder heads (sensors) such as referred to by 64, 66, etc., being provided on a cross shaped structure, Depending on a position of the stage with respect to the cross shaped structure, some of the sensors will be able to cooperate with grid structures arranged on the wafer stage WST. In this configuration, an interferometer is provided to measure a position of the stage, the interferometer position measurement may be applied to calibrate the encoder position measurements. This calibration technique however is prone to similar inaccuracies as described above with reference to the interferometer position measurement. In other words, mirror unflatness of the interferometer mirror may affect an accuracy of the interferometeric calibration measurements. In addition to the possible encoder and interferometer error sources mentioned above, the configuration described here may also be prone to take over errors between the encoders on either side of a center of the cross shaped reference structure. A 6 degrees of freedom calibration of the movable grid encoder configuration may be performed with the calibration method as disclosed in this document. This may also be the case in configurations wherein an alignment sensor is applied which is microscope CCD camera based.

Extended Stitching Marks

Figure 19A:
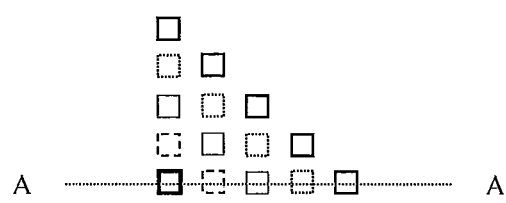

A further calibration method is described with reference to FIG. 19B. Before describing this calibration method in more detail, reference is made to U.S. Pat. No. 7,102,736 which is enclosed herein in its entirety by reference. This prior art document discloses a calibration method applied with lithographic apparatuses having interferometer based stage position measurement, the method wherein a plurality of spaced apart marks (each e.g., comprising a plurality of points) are provided on a mask, the marks being arranged diagonally on the mask in respect of both axis of measurement of the stage position in the plane of movement of the stage. An example of such mask is depicted in FIG. 19A. As depicted in FIG. 19A, the diagonal arrangement of marks will result in exposure of a diagonal pattern on the substrate. This exposure is repeated, the wafer stage being displaced with respect to the mask between successive exposures, thereby resulting in a succession of mutually displaced diagonal patterns. The exposure may be performed at the expose side of a lithographic apparatus. Read out, which may take place at the measure side of a lithographic apparatus, takes place along the line A-A in FIG. 19A. Thereby, positioning errors at the measure side and at the expose side may be separated from each other, as the points along the horizontal line A-A are read out at the measure side at a same position (along the first direction) while they have been exposed at the expose side at different positions along the first direction. Interpolation may be used for calibration in between the positions at which the calibrations have taken place.

The calibration method as will be described with reference to FIG. 19B now applies this concept to the calibration principle making use of the extended line measurements as disclosed in this document.

Figure 19A:
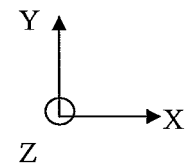
Figure 19B:
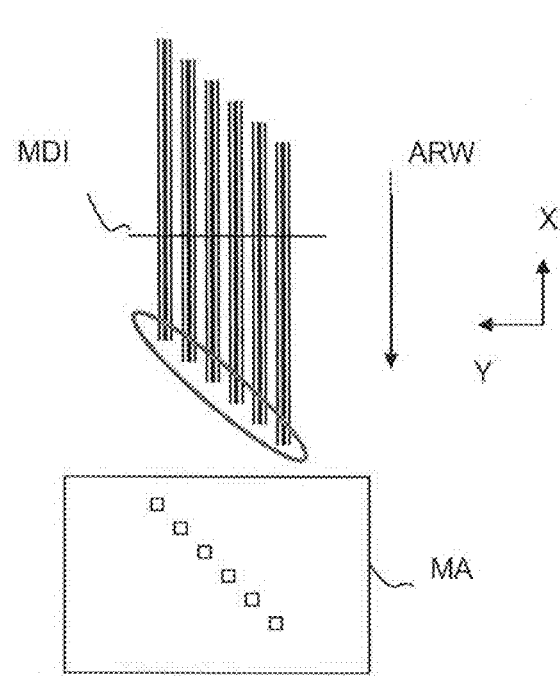

FIG. 19B schematically depicts a mask structure having a plurality of marks, which may each comprise a plurality of points. The marks are aligned diagonally in respect of the directions X and Y. When these marks would be projected onto the substrate, an exposure pattern would be provided onto the substrate, comprising a plurality of marks in a same, diagonal arrangement. According to this calibration method, during the exposure, the substrate is moved in respect of the mask in a first direction, in this example the X direction as indicated by arrow ARW. Thereby, the patterns of marks provides a plurality of extended patterns on the substrate, as depicted in FIG. 19B, the extended patterns extending in the first direction, i.e., in this example in the X direction. The diagonal arrangement of the marks, in which the marks are spaced apart in the first direction as well as in the second direction (in this example the Y direction), thereby results, when performing a movement in the first direction during the exposure, in a plurality of extended patterns which are spaced apart in the second direction in accordance with the spacing of the marks in the second direction, and which are translated with respect to each other in the first direction, in accordance with the spacing of the marks with respect to each other in the first direction. Similarly to measurement techniques described above, a position measurement at the measure side is performed of the extended patterns thus exposed onto the substrate along the first direction, the pattern position measurement being performed in the first direction. Thereby, use may be made of the fact that the different marks are spaced apart in the first direction. As a result thereof, an error in the position of the extended pattern, the error in the second (Y) direction being provided in all the extended patterns, however translated with respect to each other in the first (X direction). Again, similarly to the method described with reference to FIG. 19A, the extended patterns have been exposed onto the wafer at the expose side, while measurement takes place at the measure side of the lithographic apparatus. Measurements at the measure side are again performed for each of the parallel extended patterns, whereby, pattern parts at a same position along the first direction (similarly to the line A-A in FIG. 19A) are read out with a same positioning error at measure, while these parts of the extended patterns have been exposed at different expose positions (along the first direction). Thereby, positioning errors at the measure side and at the expose side may be separated from each other. This method may for example be employed to calibrate an unflatness of an interferometer mirror: the unflatness of the interferometer mirror along the first (X) direction resulting in a position deviation of the stage in e.g., the second direction. Due to the continuous character of the extended patterns, interpolation may be omitted, which may increase accuracy and may be result in a significant time saving as compared to the discrete approach as described with reference to FIG. 19A. Furthermore, the need to combine the calibration results with other measurement techniques may be obviated.

Figure 20A:
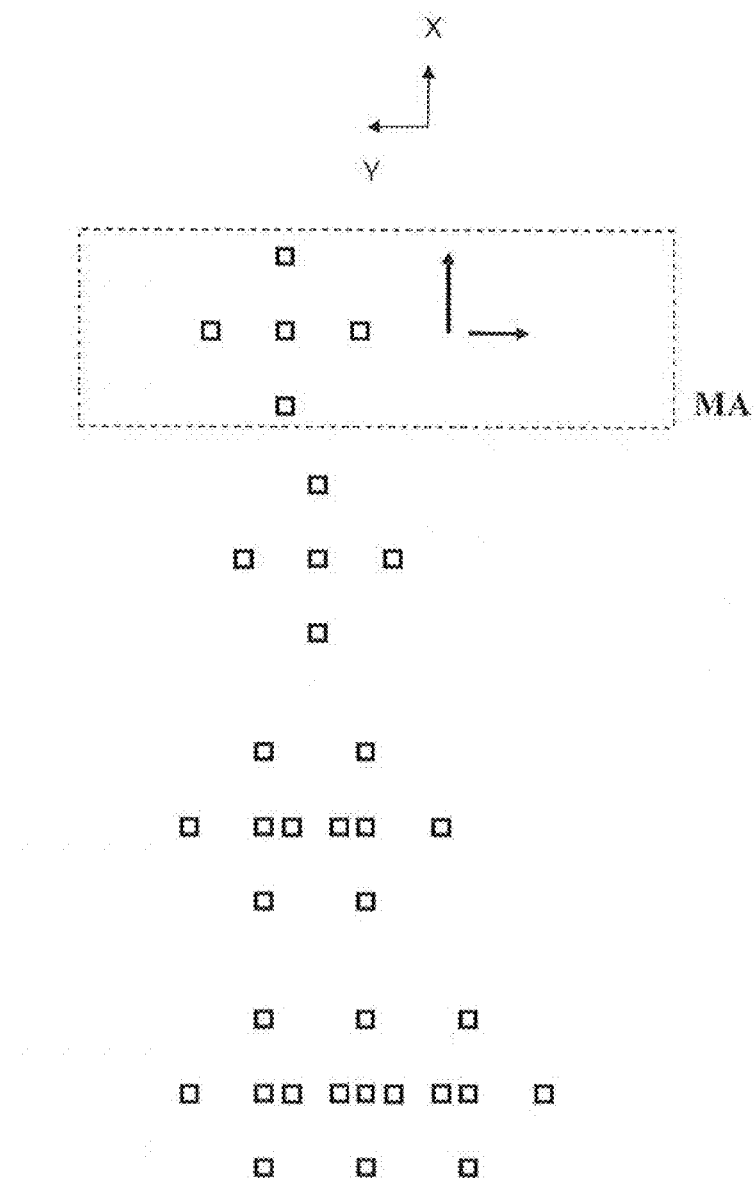

Another calibration method is described below. Firstly, reference will be made to a prior art method. In this prior art method, spaced apart marks are provided on a mask (each mark may comprise one or more points). The marks exhibit a spacing in both the first and the second direction, such as for example the marks depicted in FIG. 20A, thereby generating a cross shaped arrangement of marks, as symbolically depicted in the mask MA. Such calibration patterns are used for a so called "stitching" approach, whereby such a pattern is projected repetitively on the substrate, the substrate being displaced between successive projections over a distance slightly larger or slightly smaller than the spacing between neighboring points of the pattern. In an embodiment, the distance is slightly larger than the spacing so as to avoid overlap in complex setups or in large numbers of repetitions. As depicted in FIG. 20A, where successive exposures are depicted below each other, a center mark of a following projected pattern is exposed adjacent to an outer mark of the previously projected pattern. By a repetitive exposure of such patterning, e.g., in a two dimensional arrangement on the wafer, a repetitive pattern of nearby clusters is created, the clusters consisting of a center mark of a pattern and outer marks of adjacent patterns. Each of such clusters consists of marks that have been exposed (i.e., projected) onto the substrate at different positions of the state at the exposure side, while they can be read out at the measure side of the lithographic apparatus at nearly a single position. As now readout of nearby marks can take place at measure at nearly the same stage position, while the different nearby marks are from patterns on marks that have been exposed at different stage positions at exposure, it becomes possible to distinguish positioning errors at measure and at expose from each other. Compared to the method described with reference to FIGS. 19A and B, the method described here offers the possibility to calculate a two dimensional calibration map, also referred to as a two dimensional calibration grid (making it particularly suitable for encoder based stage position measurement), while the method described with reference to FIG. 19 may provide two single dimensional calibration data sets, also referred to as two single dimensional calibration grids. In this calibration technique described with reference to FIG. 20A, interpolation may be used to obtain position data in between the discrete measurements. Also, other measurement techniques may be applied in order to provide calibration data in a different spatial frequency range. The different measurement techniques may then be combined.

Figure 20B:
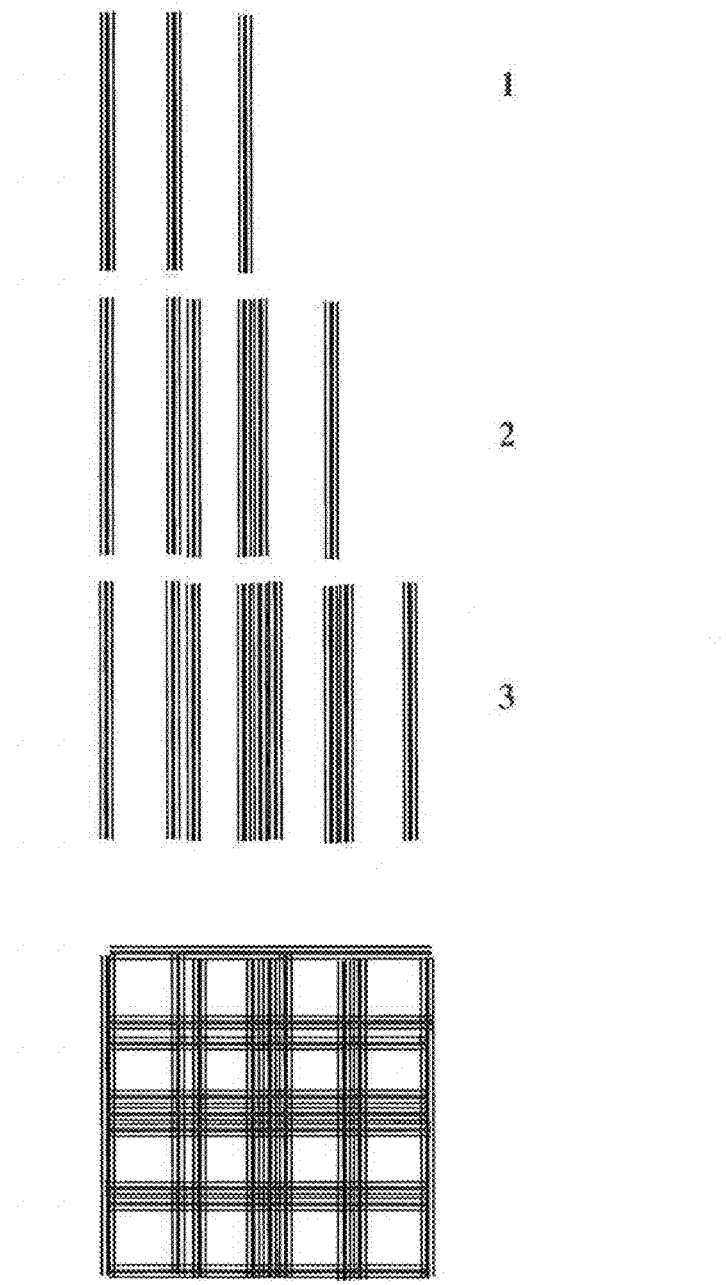

A further calibration technique according to the invention will now be described with reference to FIG. 20B In this method, use may be made of a first pattern comprising a plurality of marks spaced apart in the second direction and a second pattern comprising a plurality of marks spaced apart in the first direction. By way of example, groups of 3, 4 or 5 marks may be used. The marks may but do not necessarily need to be diagonally arranged similarly as disclosed with reference to FIG. 19B. The first pattern is exposed onto the substrate, while moving the substrate with respect to the mask in the first direction, thereby exposing the pattern referred to as 1. This process is repeated, for each repetition, the substrate having been displaced in the second direction over a distance that may be slightly larger than a distance corresponding to the spacing between the marks of the first pattern. Thereby, a plurality of extended patterns are created, which extend along the first direction, as referred to in FIG. 20B by 2 and 3. The same process is repeated using the second pattern. Thereby, during each exposure the substrate is moved in the second direction, while between successive exposures, the substrate is displaced in the first direction over a distance that may be slightly larger than a distance corresponding to the spacing between the marks of the second pattern. On the substrate, as illustrated in FIG. 20B (bottom figure), a pattern of parallel lines in both the first and second direction have been created thereby. This pattern again provides adjacent extended patterns, which have exposed at different positions of the substrate table at expose, which are however read out at measure at almost the same position. Thereby, again, the position errors at expose and at measure can be separated from each other. As compared to the conventional "stitching" approach, interpolation may be omitted, which may increase accuracy. Furthermore, the need to combine the calibration results with other measurement techniques may be obviated. Still further, as significant time saving may be achieved.

Calibration Overview

In the below, a (stage) calibration method for a lithographic apparatus is disclosed, wherein use is made of embodiments of the calibration methods disclosed in this document. Firstly, a calibration method for a lithographic apparatus having an interferometer based stage position measurement is disclosed, followed by a discussion of a calibration method for a lithographic apparatus having an encoder based stage position measurement.

Generally, a wafer stage positioning system for lithography, interferometer or encoder based, makes use of a large, two dimensional range of at least a size of the substrate, e.g., 300 mm in X and Y. In general, 6 degrees of freedom are measured.

An Interferometer position measurement system for such a large 2D XY range may make use of mirrors extending in a direction perpendicular to the interferometer beam, to keep track while moving in the direction perpendicular to the measurement direction. For an X measuring interferometer this reflecting mirror is extended in the Y direction and vice versa. An X interferometer system regularly measures also additional DOF, such as Rz and Ry by using additional parallel interferometers. A same holds for Y measuring Rz and Rx. For these additional measurements similar with extended size, or parallel additional reflecting surfaces are used. For Z direction, interferometers are used, interferometer beams of which being reflected by a stage mirror to a reference mirror, such that chuck Z movements change beam lengths, which can be detected. In general a interferometer based stage position measurement system may make use of extended mirrors for all 6 degrees of freedom. These mirrors do not generally have the flatness that would be required to fulfill a specified grid accuracy.

In an embodiment, the stage calibration method may comprise:

In a first step, an X correction map as function of Y movement may be determined making use of the calibration method described with reference to FIG. 19B.

In a second step, a Y correction map as function of X may be determined using a same method.

In a third step, Rz as function of XY correction map may be determined based on the calibration methods disclosed in this document, making use of the double gridlines such as for example described with reference to FIG. 9A.

In a fourth step, Z as function of XY may be derived with the calibration methods disclosed in this document, making use of the special purpose Z sensitive extended pattern as disclosed in this document.

In a fifth step, Rx, and Ry maps as function of XY may be derived with the calibration methods disclosed in this document, making use of the double special purpose Z sensitive extended gridlines as disclosed in this document.

In a sixth step, a non orthogonal angle between X and Y mirrors may be determined with the calibration methods disclosed in this document, applying rotating 90 degree stitched patterns as disclosed in this document.

The steps may, but not necessarily need to be performed in the listed order.

Calibration of an Encoder based stage position measurement (both for the above described stationary grid and movable grid encoder configurations) may be similar to the calibration of the interferometer based state position measurement configuration. The above described stage calibration method may thus also be applied for interferometer based stage position measurement.

The encoder grating may be used as a reference for the 6 degrees of freedom (DOF) stage position. This grating (grid) may be not ideal and not flat, which may result in 6 DOF stage position errors.

It is generally remarked that in the stage calibration method, the calibration described with reference to FIG. 20B may (e.g., in an encoder based stage configuration) optionally take the place of the calibration described with reference to FIG. 19B.

Correction maps may be executed in a same way in an encoder mathematical model connecting encoder measurements to 6 DOF stage position as in the interferometer mathematical model, which connects interferometer readings to 6 DOF stage positions.

General Remarks

In an embodiment the method according to the invention is arranged to improve calibration of the encoder measurement system, and in particular an encoder comprising a grid. In order to calibrate such a specific encoder measurement system, a plurality of calibrations is performed in prior art:

Grid errors in a low spatial frequency can be calibrated by a conventional stitch approach wherein patterns are repeatedly projected onto the substrate at a mutual distance. Furthermore, use may be made of a high spatial frequency calibration wherein use is made of an inertia of the stage: high spatial frequency grid errors will not be followed by the stage when moving at a constant velocity with a low control loop bandwidth. Thirdly, a two dimensional expose grid calibration may be applied, which may be aimed at reducing a chuck to chuck fingerprint and compensate chuck dependent deformations due to substrate clamping, and may also calibrate cooling induced grid deformations. Embodiments of the invention alleviated these problems.

A more specific desire in prior art arrangements is to improved calibration for calibrating the stage position of the lithographic apparatus. Another desire is to provide an improved detection method that provides more information with respect to a certain surface area of a substrate. It is desirable to improve the information density per surface area. It is further desirable to provide a detection method resulting in information with respect to a large surface area in a shorter time span. At least some embodiments as described in the application improve prior art arrangements according to these desires.

Although in the above a specific example has been provided for a detection method and in particular a calibration of an encoder measurement system of the stage, the detection and calibration as described in this document may be applied to a stage having any type of position measurement system, such as interferometer, 1 dimensional encoder, 2 dimensional encoder, interferometer/encoder combinations, inductive, capacitive, etc.

Although in the above a specific example has been provided for a detection method and in particular a calibration of an encoder measurement system of the stage, the detection and calibration as described in this document may be applied for controlling and correcting lens heating in a lithographic apparatus. In an embodiment an extended pattern is formed repeatedly using the same pattern, while moving the substrate table with substrate. Repeatedly patterning results in lens heating and local deviations. A detection method, wherein a property of the extended pattern along its first direction is measured can provide information with respect to the deviations that are a result of lens heating and can be used for correcting for such lens heating.

The above calibration may be implemented in a lithographic apparatus by e.g., a suitable programming of a controller which controls the operation of the lithographic apparatus. Instead of or in addition to programming by way of suitable programming instructions, any other way to make the controller arranged so as to have the calibration method performed, may be applied (e.g., dedicated hardware, etc).

Inline tracking of each order may be useful in monitoring common noise terms.

While the flank scan is performed the substrate table can also move through Z to compensate for an effect know as wafer induced coherence offset Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV)

radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the clauses and claims set out below.

What is claimed is:

1. A method for measuring a property of an extended pattern formed by one or more lines generally extending in a first direction wherein each line comprises one or more features, comprising:
   using the one or more features for measuring a property of the extended pattern at different positions along the first direction using a sensor, the measuring at different positions comprising changing relative positions of the sensor and a support structure for supporting an object comprising the extended pattern;
   exciting a natural frequency vibration of the support structure or modulating the relative positions in the second direction of the sensor and the support structure around the reference position using a servo; and
   wherein the measuring comprises demodulating a signal from the sensor.

2. A method according to claim 1, wherein the measured property is the intensity of a diffraction order of radiation diffracted by gridlines forming the extended pattern.

3. A method according to claim 2, comprising
   detecting intensity of at least one further diffraction order, and
   determining a second property of the extended pattern based on differences in variations of the intensity between the diffraction order and the at least one further diffraction order.

4. A method according to claim 3, comprising determining intensity of at least one fractional diffraction order with respect to the intensity of at least one integer diffraction order.

5. A method according to claim 1, comprising
   determining a reference position for the relative positions of the sensor based upon maximum sensitivity of the signal from the sensor for the detected property;
   measuring with the sensor the property of the extended pattern at different positions along the first direction by moving the sensor and a support structure to further relative positions;
   determining an expression for substrate reflectivity based on the signal from the sensor at the relative positions and on the signal from the further relative positions; and
   correcting the measured property at the relative positions with the determined substrate reflectivity.

6. A method according to claim 1, wherein:
   the object has a surface facing the sensor and wherein the one or more features protrude from the surface.

7. A method according to claim 1, wherein:
   the object, at the position of the extended pattern, has a minimum dimension in the first direction and wherein at least one of the lines comprises a feature which extends over a major part of the minimum dimension.

8. A method according to claim 1, wherein the object is a fiducial member mounted on the support structure or a substrate releasably clamped on the support structure.

* * * * *